(12) United States Patent
Tsujimura et al.

(10) Patent No.: US 11,245,085 B2
(45) Date of Patent: Feb. 8, 2022

(54) SELF LIGHT-EMITTING ELEMENT AND MANUFACTURING PROCESS OF SELF LIGHT-EMITTING ELEMENT, SELF LIGHT-EMITTING DISPLAY DEVICE, AND ELECTRONIC EQUIPMENT

(71) Applicant: JOLED Inc., Tokyo (JP)

(72) Inventors: Hiroki Tsujimura, Tokyo (JP);
Kazuhiro Yokota, Tokyo (JP);
Hideyuki Shirahase, Tokyo (JP);
Kazuhiro Yoneda, Tokyo (JP)

(73) Assignee: JOLED INC., Tokyo (JP)

( * ) Notice: Subject to any disclaimer, the term of this patent is extended or adjusted under 35 U.S.C. 154(b) by 41 days.

(21) Appl. No.: 16/817,614

(22) Filed: Mar. 13, 2020

(65) Prior Publication Data

US 2020/0295290 A1 Sep. 17, 2020

(30) Foreign Application Priority Data

Mar. 15, 2019 (JP) .............................. JP2019-048786
Nov. 22, 2019 (JP) .............................. JP2019-211445

(51) Int. Cl.
*H01L 51/50* (2006.01)
*H01L 51/56* (2006.01)

(52) U.S. Cl.
CPC .......... *H01L 51/506* (2013.01); *H01L 51/504* (2013.01); *H01L 51/5092* (2013.01); *H01L 51/56* (2013.01)

(58) Field of Classification Search
CPC . H01L 51/506; H01L 51/504; H01L 51/5092; H01L 2251/5346; H01L 51/508
See application file for complete search history.

(56) References Cited

U.S. PATENT DOCUMENTS

| | | |
|---|---|---|
| 2004/0222737 A1 | 11/2004 | Raychaudhuri et al. |
| 2009/0096357 A1 | 4/2009 | Lee et al. |
| 2010/0213438 A1 | 8/2010 | Cho et al. |
| 2010/0302221 A1 | 12/2010 | Okumoto |
| 2015/0357593 A1 | 12/2015 | Gunji et al. |
| 2016/0172620 A1 | 6/2016 | Hashimoto et al. |
| 2016/0172628 A1 | 6/2016 | Hashimoto et al. |

FOREIGN PATENT DOCUMENTS

| | | |
|---|---|---|
| JP | 6-314594 A | 11/1994 |
| JP | 2004-200031 A | 7/2004 |
| JP | 2004-335468 A | 11/2004 |
| JP | 2009-094456 A | 4/2009 |
| JP | 2010-199067 A | 9/2010 |
| JP | 2012-018938 A | 1/2012 |
| JP | 2015-231018 A | 12/2015 |
| JP | 2016-115717 A | 6/2016 |
| JP | 2016-115718 A | 6/2016 |
| JP | 2016-143797 A | 8/2016 |

*Primary Examiner* — Anthony Ho

(74) *Attorney, Agent, or Firm* — Xsensus LLP

(57) ABSTRACT

Disclosed is a self light-emitting element including a first electrode, a light-emitting layer disposed above the first electrode, a function layer disposed above the light-emitting layer, and doped with a metal, and a second electrode disposed above the function layer, in which the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer.

13 Claims, 14 Drawing Sheets

G11 —·— SINGLE-LAYER ETL STRUCTURE (DOPED WITH Yb)
G12 —··— TWO-LAYER ETL STRUCTURE (LOW Yb CONCENTRATION IN LAYER ON LIGHT-EMITTING LAYER SIDE)
G13 —— THREE-LAYER ETL STRUCTURE (NOT DOPED WITH Yb IN MIDDLE 2ND LAYER)

(ENVIRONMENTAL TEMPERATURE: 85°C)

FIG. 15A    FIG. 15C
FIG. 15B    FIG. 15D
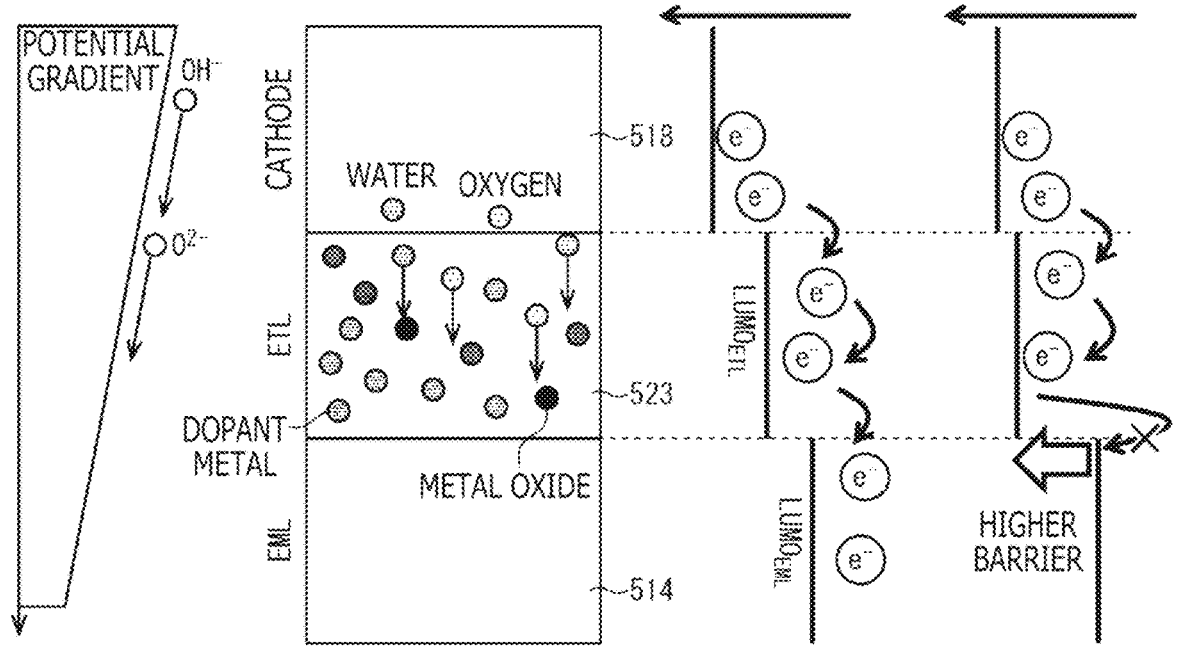
FIG. 16
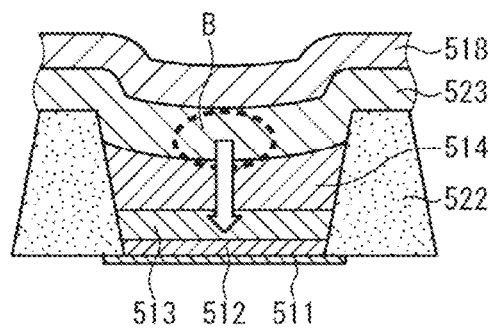

SELF LIGHT-EMITTING ELEMENT AND MANUFACTURING PROCESS OF SELF LIGHT-EMITTING ELEMENT, SELF LIGHT-EMITTING DISPLAY DEVICE, AND ELECTRONIC EQUIPMENT

CROSS-REFERENCE TO RELATED APPLICATIONS

The present application claims priority to JP 2019-048786, filed Mar. 15, 2019, and JP 2019-211445, filed Nov. 22, 2019, the entire contents of each are incorporated herein by reference.

BACKGROUND

The present disclosure relates to a self light-emitting element such as an organic electroluminescent element (hereinafter called "organic EL element") and its manufacturing process, and also to a self light-emitting display device and electronic equipment, each of which uses, as an image display section, a self light-emitting panel with a plurality of such self light-emitting elements arrayed in a matrix pattern on a substrate.

In recent years, organic EL panels with a plurality of organic EL elements arrayed along row and column directions on a substrate have been put into practical use as self light-emitting displays for electronic equipment. An organic EL element is a current-driven self light-emitting element having a basic structure in which an organic light-emitting layer with an organic light-emitting material contained therein is disposed between a pair of electrodes including an anode and a cathode. When a voltage is applied across the pair of electrodes upon driving, the current-driven self light-emitting element emits light in association with recombination of holes, which are injected from the anode into the organic light-emitting layer, and electrons, which are injected from the cathode into the organic light-emitting layer.

In such an organic EL panel, an electron transport layer is generally disposed between a cathode and an organic light-emitting layer to make improvements in the injection property of electrons from the cathode into the organic light-emitting layer. To achieve improvements in light extraction based on optical interference effects, a thin film of a metal such as silver or a transparent film of a metal oxide such as indium zinc oxide (IZO) is used as the cathode. Such a cathode is, however, not considered to be good in electron injection property because there is a difference in lowest unoccupied molecular orbital (LUMO) energy level and hence a large energy barrier between the cathode and the organic light-emitting layer.

Accordingly, a configuration with a compound of an alkali metal or an alkaline earth metal doped in an organic layer, which forms an electron transport layer, is disclosed in JP 2009-94456 A, for example.

Such alkali metals and alkaline earth metals are low in work function and are high in ability to inject and transport electrons from a cathode, and therefore can keep low a voltage (hereinafter called "driving voltage") to be applied across an anode and the cathode for the supply of a current needed for the emission of light from an organic EL element, thereby contributing to reduced power consumption.

SUMMARY

In an organic EL element of such a configuration as described above, however, the driving voltage may abruptly rise when the driving time reaches a certain fixed time or longer under specific conditions, so that the organic EL element may be lowered in luminescence and reduced in product life.

This disclosure has been made in view of the foregoing problem, and it is desirable to provide a self light-emitting element that enables a prolongation of its service life by suppressing an abrupt rise in driving voltage while ensuring good luminous efficacy, and its manufacturing process, and a self light-emitting display device, and electronic equipment that use a plurality of such self light-emitting elements.

A self light-emitting element according to a first aspect of this disclosure includes a first electrode, a light-emitting layer disposed above the first electrode, a function layer disposed above the light-emitting layer, and doped with a metal, and a second electrode disposed above the function layer, in which the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer.

A self light-emitting element according to a second aspect of this disclosure includes a first electrode, a light-emitting layer disposed above the first electrode, a function layer disposed above the light-emitting layer, and doped with a metal, and a second electrode disposed above the function layer. The function layer is divided, in a thickness direction thereof, in a region on a side of the light-emitting layer, a region on a side of the second electrode, and a middle region between the region on the side of the light-emitting layer and the region on the side of the second electrode, and the middle region is doped with the metal at a lower concentration than the region on the side of the light-emitting layer and the region on the side of the second electrode.

A self light-emitting display device according to a third aspect of this disclosure includes: a substrate; a self light-emitting panel including a substrate and a plurality of self light-emitting elements as arrayed in a matrix pattern above the substrate, the self light-emitting elements each including a first electrode, a light-emitting layer disposed above the first electrode, a function layer disposed above the light-emitting layer, and doped with a metal, and a second electrode disposed above the function layer, in which the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer; and a drive section configured to drive the self light-emitting panel such that an image is displayed.

Electronic equipment according to a fourth aspect of this disclosure includes, as an image display section, the self light-emitting display device including a substrate, a self light-emitting panel including a substrate and a plurality of self light-emitting elements as arrayed in a matrix pattern above the substrate, the self light-emitting elements each including a first electrode, a light-emitting layer disposed above the first electrode, a function layer disposed above the light-emitting layer, and doped with a metal, and a second electrode disposed above the function layer, in which the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer, and a drive section configured to drive the self light-emitting panel such that an image is displayed.

A manufacturing process of a self light-emitting element, which pertains to a fifth aspect of this disclosure, includes a first step of forming a first electrode, a second step of forming a light-emitting layer above the first electrode, a third step of forming, above the light-emitting layer, a function layer having a multilayer structure of at least three layers that includes at least two layers doped with a metal, and a fourth step of forming a second electrode above the function layer. The function layer of the multilayer structure includes an uppermost layer as one of the at least two layers, a lowermost layer as another one of the at least two layers, and an intermediate layer between the uppermost layer and the lowermost layer, and the intermediate layer is doped with the metal at a lower concentration than the uppermost layer and the lowermost layer.

A manufacturing process of a self light-emitting element, which pertains to a sixth aspect of this disclosure includes a first step of forming a first electrode, a second step of forming a light-emitting layer above the first electrode, a third step of forming, above the light-emitting layer, a function layer doped with a metal, and a fourth step of forming a second electrode above the function layer. The function layer is divided, in a thickness direction thereof, in a region on a side of the light-emitting layer, a region on a side of the second electrode, and a middle region between the region on the side of the light-emitting layer and the region on the side of the second electrode, and the middle region is doped with the metal at a lower concentration than the region on the side of the light-emitting layer and the region on the side of the second electrode.

According to the above-described first and second aspects, it is possible to provide self light-emitting elements, which enable a prolongation of the service life by suppressing the driving voltage from abruptly rising while ensuring good luminous efficacy. The use of a plurality of such self light-emitting elements as in the above-described third and fourth aspects can provide a self light-emitting display device and an electronic equipment, both of which can exhibit similar advantageous effects. The manufacturing processes according to the fifth and sixth aspects can provide self light-emitting elements of the first and second aspects, respectively.

BRIEF DESCRIPTION OF THE DRAWINGS

FIGS. 15A to 15D are diagrams illustrating that the electron injection and transport properties in an electron transport layer are deteriorated by oxidation of a dopant metal in an electron transport layer; and FIG. 16 is a view schematically illustrating a concentration of a load current in a subpixel at a time of forming a light-emitting layer in an organic EL element by a wet process.

DETAILED DESCRIPTION OF THE PREFERRED EMBODIMENTS

<<Circumstances LED to Respective Aspects of this Disclosure>>

As also disclosed in JP 2009-94456 A, a conventional organic EL element is configured to optimize luminous efficacy in an organic light-emitting layer by interposing an electron transport layer, in which an organic material is doped with an alkali metal or alkaline earth metal having a low work function, between a cathode and the organic light-emitting layer to facilitate the movement of electrons into the organic light-emitting layer, and hence maintaining a good carrier balance.

However, such a conventional configuration has been found to involve a problem that the driving voltage abruptly rises with the passage of the driving time if the environmental temperature rises to a certain fixed temperature or higher or if the load current increases more than needed.

Figure 14A:
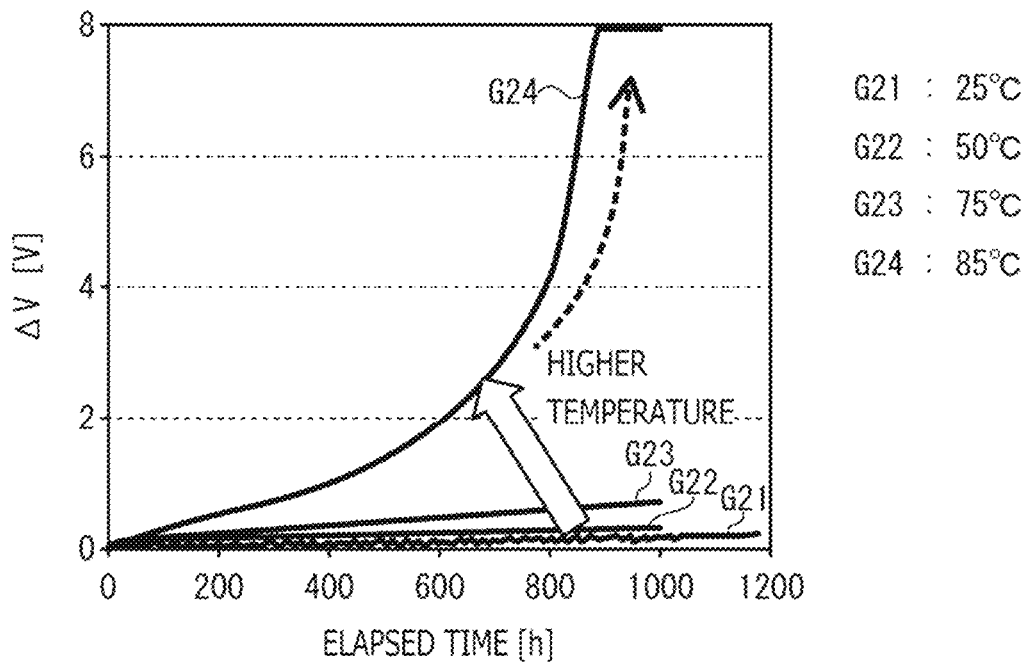
FIG. 14A is a graph illustrating the course of changes in driving voltage to a conventional organic EL element at different environmental temperatures.

FIG. 14A illustrates experimental results presenting changes in driving voltage (voltage increments from an initial stage of driving) when constant current control was performed to apply a predetermined driving current required to cause the emission of light from an organic EL element where the environmental temperature of the organic EL element was 25° C., 50° C., 75° C. and 85° C., respectively. The axis of abscissas represents the continuous driving time of the organic EL element (the elapsed time [h]), and the axis of ordinates represents the driving voltage increment ($\Delta V$ [V]) from the starting time of driving.

It is to be noted that this example presents the results of accelerated experiments conducted by setting the driving current twice as high as the current at the time of normal driving (at substantially 12 mA/cm$^2$).

Where the environmental temperature was 25° C. (line G21), 50° C. (line G22) and 75° C. (line G23) as presented in FIG. 14A, no substantial rise was observed in driving voltage even after an elapsed time of 1,000 hours. When the environmental temperature arose to 85° C. (line G24), however, the driving voltage abruptly arose after an elapsed time of 500 hours, leading to a reduction in the service life of the organic EL panel.

Taking into consideration the versatility of future use of organic EL elements, organic EL elements having sufficient durability even in a use environment as high as 85° C. are desired because there is a sufficient possibility that the temperature will rise to such a high temperature, for example, in the inside or the like of the windshield of an automotive vehicle or at a like place under the scorching sun in summer.

Figure 14B:
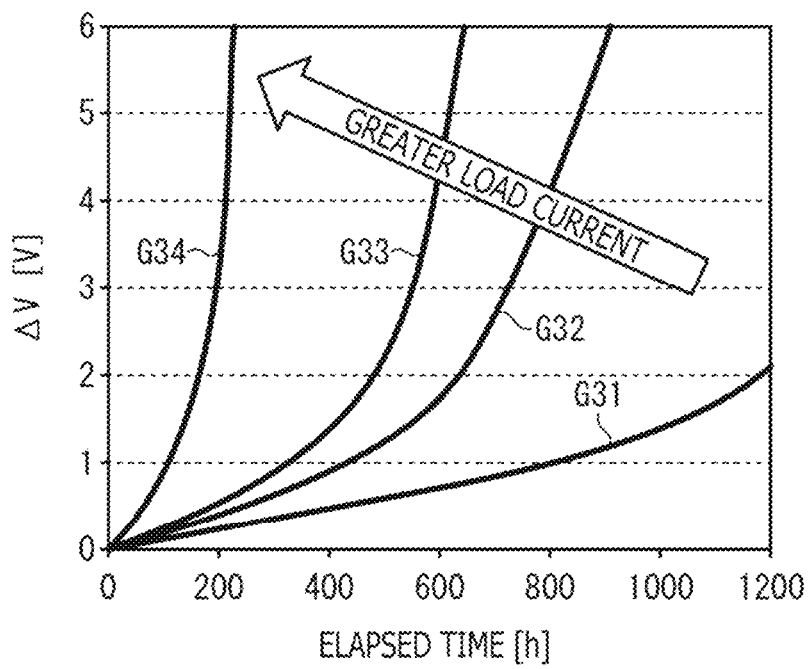
FIG. 14B is a graph illustrating the course of changes in driving voltage when a load current to be applied to the conventional organic EL element is increased.

Meanwhile, FIG. 14B is a graph illustrating a relationship between increases in load current to be applied to an organic EL element and increments ($\Delta V$ [V]) in driving voltage. In this experiment, an accelerated experiment was conducted with an environmental temperature set at 85° C.

In this experiment, the load current indicated by line G31 was 6 mA/cm$^2$, the load current became greater as it moved leftward to line G32 and further to line G33, and at line G34, the load current reached 18 mA/cm$^2$.

It has been found by the experiments that the driving voltage abruptly rises at an earlier stage as the load current to the organic EL element becomes greater.

From the results of the series of experiments in FIGS. 14A and 14B, the present inventors considered as will be described next about the cause of the abrupt rise in driving voltage.

FIGS. 15A to 15D are schematic diagrams illustrating the details of the consideration.

Individual function layers included in an organic EL element are deteriorated in their characteristics if exposed to external water and oxygen, so that an upper portion of a cathode is generally covered at an entire surface thereof with a sealing layer.

However, it is difficult to completely prevent penetration of external oxygen and water by the sealing layer. External oxygen and water hence soak inside the organic EL element although in extremely small amounts. Especially in a flexible organic EL panel, limitations are imposed on the material and thickness of a sealing layer to ensure its flexibility. There are accordingly limitations to the complete prevention of penetration of oxygen and water. In addition, water may remain in a manufacturing step or steps before forming the sealing layer.

Inside the organic EL element, an electric field is formed by a voltage applied between the cathode and an anode, and a potential gradient such as that illustrated in FIG. 15A is formed in the thickness direction. Portions of oxygen molecules and water molecules are converted to negative ions (hereinafter called "oxygen ions and the like") such as oxygen ions ($O^{2-}$) and hydroxide ions ($OH^-$) through decomposition, and the oxygen ions and the like move from a cathode 518 in an upper portion toward a lower organic light-emitting layer (EML layer) 514 along the potential gradient of FIG. 15A in an electron transport layer (ETL layer) 523 (see FIG. 15B).

Meanwhile, as the environmental temperature rises, the activity of the dopant metal in the electron transport layer 523 becomes higher so that a portion or a large majority of the dopant metal reacts with oxygen ions and the like to form a metal oxide. The alkali metal or the like as the dopant metal therefore significantly loses its characteristic, that is, electron injection property.

As a consequence, a greater difference arises between the energy level of the LUMO (hereinafter called "LUMO level") of the electron transport layer 523 in particular and the LUMO level of the organic light-emitting layer 514, so that the energy barrier increases to make it difficult for electrons to move from the electron transport layer 523 to the organic light-emitting layer 514 (see FIG. 15D).

Under constant current control, the diving voltage is adjusted to supply a constant current to the organic light-emitting layer. However, as the oxidation of the dopant metal proceeds and the energy barrier increases as mentioned above, electrons become more difficult to move, so that the driving voltage has to be increased.

As the driving voltage increases, the ionization of the alkali metal or the like is promoted, whereby reactions with oxygen ions and the like occur at an accelerated rate. For this reason, the driving voltage is also considered to rise abruptly.

If the load current increases as illustrated in FIG. 14B, the dopant metal is activated, and in addition, an action to pull oxygen ions and the like from the cathode toward the anode is enhanced. Since the dopant metal is continuously dispersed in the thickness direction, the dopant metal is oxidized in chain reactions. In this instance, the driving voltage also rises abruptly.

Especially when the organic light-emitting layer 514 is formed by a process that applies an ink, followed by drying (wet process), it is difficult to completely planarize the surface of the organic light-emitting layer 514.

FIG. 16 is a schematic cross-sectional view of an organic EL element formed by a wet process.

As illustrated in the figure, in an opening above a pixel electrode 511 and between a pair of banks 522, a hole injection layer 512 and a hole transport layer 513 are stacked, and the organic light-emitting layer 514 is then formed through application of an ink by the wet process. As is known well, however, the applied ink is dried earlier at its edge portions which are in contact with the banks 522, and drying of its central portion proceeds later. Therefore, the central portion of the organic light-emitting layer 514 inevitably has a little smaller thickness compared with the edge portions.

The organic light-emitting layer 514 has a lower resistance value at the portion of the smaller thickness than the remaining portions. When a voltage is applied between the pixel electrode 511 and the cathode 518, a current flows concentrating at the central portion (the area surrounded by a dashed line B) of the electron transport layer 523. Accordingly, a greater load current occurs at the central portion, so that, as described with reference to FIG. 14B, the oxidation of the dopant metal is promoted to result in a higher possibility of an abrupt rise in driving voltage.

Such a problem is not limited to organic EL panels using organic EL elements as self light-emitting elements but may also occur commonly among practically all self light-emitting panels including self light-emitting elements with one or more function layers formed by a wet process, such as quantum dot panels configured of quantum dot light-emitting diodes (QLED).

To develop a self light-emitting element of a structure that sufficiently suppresses an abrupt rise in driving voltage due to a rise in environmental temperature and a concentration of a load current and hence ensures a long service life, the present inventors have therefore conducted a great deal of research and as a result, have led to the respective aspects of this disclosure.

<<Summary of Respective Aspects of this Disclosure>>

The self light-emitting element according to the first aspect of this disclosure includes the first electrode, the light-emitting layer disposed above the first electrode, the function layer disposed above the light-emitting layer and doped with the metal, and the second electrode disposed above the function layer, the function layer has the multilayer structure of at least three layers including the uppermost layer, the lowermost layer and the intermediate layer between the uppermost layer and the lowermost layer, and the intermediate layer is doped with the metal at the lower concentration than the uppermost layer and the lowermost layer.

According to the first aspect as described above, it is possible to significantly delay the time until water and oxygen penetrated from the outside reach the lowermost layer in the function layer, the lowermost layer being on the side of the light-emitting layer, whereby an abrupt increase in driving voltage can be avoided.

In the first aspect of this disclosure, the first electrode may be an anode, the second electrode may be a cathode, and the metal doped in the function layer may be one or more metals selected from a group of metals belonging to the alkali metal group, the alkaline earth metal group and the rare earth metal group.

The metals belonging to the alkali metal group, the alkaline earth metal group and the rare earth metal group are low in work function, and therefore can make improvements in the electron injection property from the cathode.

In the first aspect of this disclosure, the function layer may contain, as a host material, an organic material having at least one of electron transport property or electron injection property.

This enables to ensure the movement of a certain number of electrons even if the concentration of the dopant metal in the intermediate layer of the electron transport layer is lowered.

In the first aspect of this disclosure, a non-doped layer not doped with the metal may be included as the intermediate layer.

Owing to the interposition of the non-doped layer in the intermediate layer, oxygen and water are suppressed from proceeding to the lowermost layer in the function layer.

In the first aspect of this disclosure, the non-doped layer may have a thickness of at least 5 nm.

This enables to obtain sufficient effects to suppress the proceeding of oxygen and water in the non-doped layer.

In the first aspect of this disclosure, the function layer may have a three-layer structure.

This enables to avoid an abrupt rise in driving voltage by the minimum number of stacked layers, and therefore is excellent in manufacturing cost.

In the first aspect of this disclosure, the lowermost layer and uppermost layer in the function layer may each have a thickness of 5 nm or greater and 30 nm or smaller.

In the first aspect of this disclosure, the lowermost layer and uppermost layer in the function layer may each be doped with the metal at 10 wt % or higher and 60 wt % or lower.

This enables to avoid a reduction in light transmission, which would otherwise occur for an excessively high concentration of the dopant metal, while improving the electron injection property and hence the luminous efficacy.

In the first aspect of this disclosure, the lowermost layer of the function layer may be doped with the metal at a higher concentration than the uppermost layer.

The electron injection property is improved by lowering an energy barrier especially between the light-emitting layer and the lowermost layer of the function layer, the lowermost layer being in a proximity to the light-emitting layer. It is accordingly advantageous to make the doping concentration of the lowermost layer higher than that of the uppermost layer if the total amount of the dopant metal in the function layer is the same.

The self light-emitting element according to the second aspect of this disclosure includes the first electrode, the light-emitting layer disposed above the first electrode, the function layer disposed above the light-emitting layer and doped with the metal, and the second electrode disposed above the function layer. The function layer is divided, in the thickness direction thereof, in the region on the side of the light-emitting layer, the region on the side of the second electrode, and the middle region between the region on the side of the light-emitting layer and the region on the side of the second electrode. The middle region is doped with the metal at the lower concentration than the region on the side of the light-emitting layer and the region on the side of the second electrode.

According to the second aspect as described above, it is also possible to significantly delay the time until water and oxygen penetrated from the outside reach the region in the function layer, the region being on the side of the light-emitting layer, and hence to avoid an abrupt rise in driving voltage.

In the second aspect of this disclosure, the light-emitting layer may be a coating film.

If the light-emitting layer is the coating film, the light-emitting layer may have a smaller thickness at a central portion thereof and a load current may concentrate at the central portion. Even in such a case, the penetration of water and oxygen into the lowermost layer can be significantly delayed to avoid an abrupt rise in driving current by configuring the function layer in the multilayer structure and lowering the doping concentration of the metal in the middle layer than those in the uppermost layer and lowermost layer.

Further, the self light-emitting display device according to the third aspect of this disclosure includes the substrate, the self light-emitting panel including the substrate and the plurality of any ones of the above-described self light-emitting elements as arrayed in the matrix pattern above the substrate, and the drive section configured to drive the self light-emitting panel such that the image is displayed.

Still further, the electronic equipment according to the fourth aspect of this disclosure includes, as the image display section, the above-described self light-emitting display device.

These self light-emitting display device and electronic equipment are excellent in the luminous efficacy of the display panel, and can ensure a prolonged service life.

Furthermore, the manufacturing process of the self light-emitting element, which pertains to the fifth aspect of this disclosure, includes the first step of forming the first electrode, the second step of forming the light-emitting layer above the first electrode, the third step of forming, above the light-emitting layer, the function layer having the multilayer structure of at least three layers that includes at least two layers doped with the metal, and the fourth step of forming the second electrode above the function layer. The function layer of the multilayer structure includes the uppermost layer as one of the at least two layers, the lowermost layer as the other one of the at least two layers, and the intermediate layer between the uppermost layer and the lowermost layer. The intermediate layer is doped with the metal at the lower concentration than the uppermost layer and the lowermost layer.

In the fifth aspect of this disclosure, a non-doped layer not doped with the metal may be included as the intermediate layer.

In addition, the manufacturing process of the self light-emitting element, which pertains to the sixth aspect of this disclosure, includes the first step of forming the first electrode, the second step of forming the light-emitting layer above the first electrode, the third step of forming, above the light-emitting layer, the function layer doped with a metal, and the fourth step of forming the second electrode above the function layer. The function layer is divided, in the thickness direction thereof, in the region on the side of the light-emitting layer, the region on the side of the second electrode, and the middle region between the region on the side of the light-emitting layer and the region on the side of the second electrode. The middle region is doped with the metal at the lower concentration than the region on the side of the light-emitting layer and the region on the side of the second electrode.

This enables to significantly delay the time until external water and oxygen reach the lowermost layer of the function layer, and hence to provide a self light-emitting element of a long service life.

In the aspects of the disclosure in this specification, the term "above" does not indicate an upper direction (vertically above) in absolute spatial awareness, but is defined by a relative positional relationship based on the order of stacking in the stacked structure of each self light-emitting element. Described specifically, in the self light-emitting element, a direction that is vertical to a principal plane of a substrate and is on a side directed from the substrate toward the side of a stack is defined to be an upper direction. Where expressed as "on a substrate," for example, this expression should indicate not only a region which is in direct contact with the substrate but also a region above the substrate with the stack interposed therebetween. Also, where expressed, for example, as "above a substrate," this expression shall indicate not only a region above the substrate with a space left therebetween but also a region on the substrate.

<<Embodiments>>

For the first aspect of this disclosure, specifically an organic EL element as a self light-emitting element, and an organic EL panel and an organic EL display device, each of which uses a plurality of such organic EL elements, a description will hereinafter be given with reference to the relevant drawings. It is to be noted that the drawings include schematic ones and the scale, the vertical-to-horizontal ratio and the like of each member may be different from their actual values.

1. Overall Configuration of Organic EL Display Device 1

Figure 1:
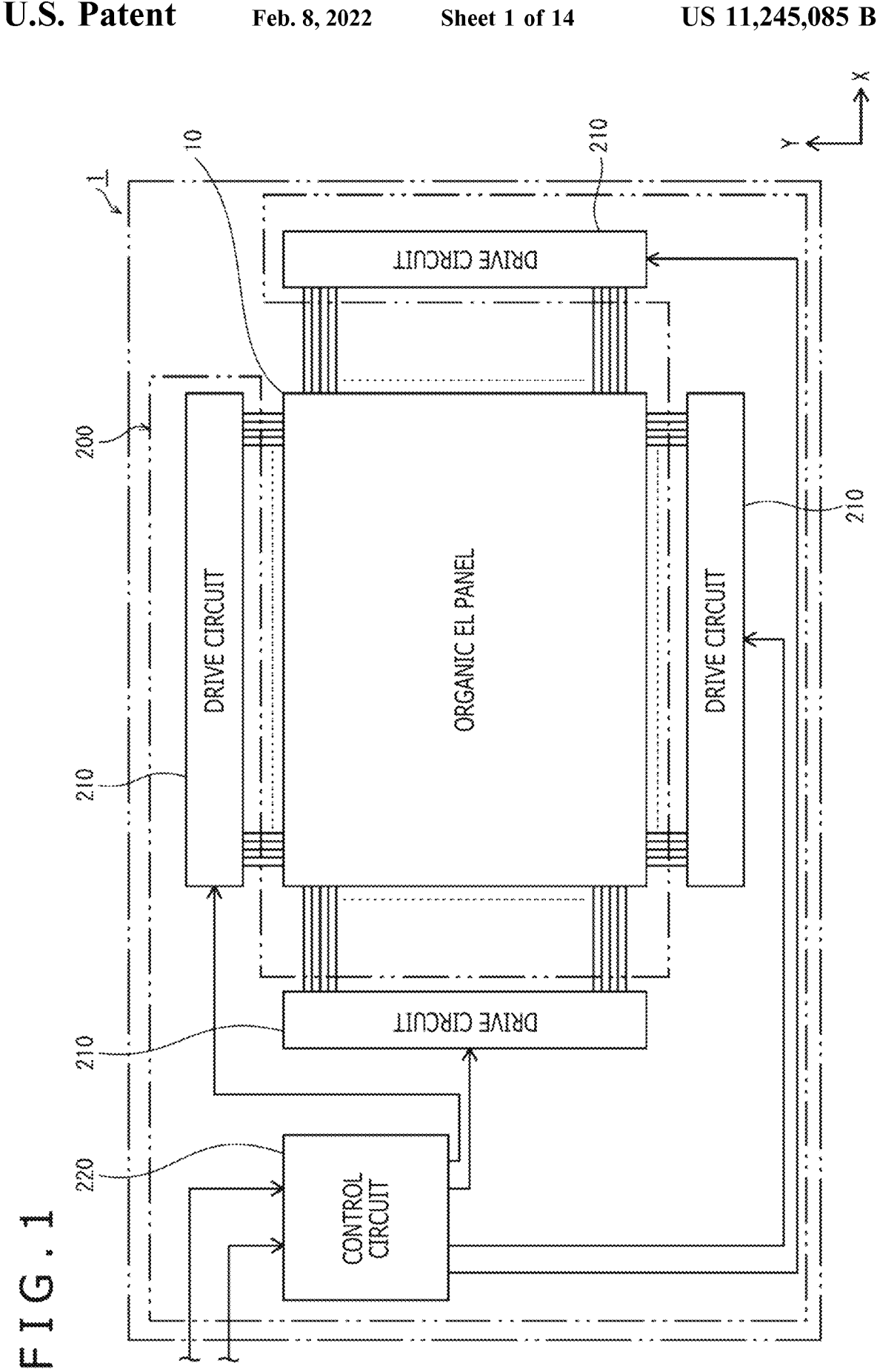
FIG. 1 is a block diagram illustrating an overall configuration of an organic EL display device according to a third aspect of this disclosure.

FIG. 1 is a block diagram depicting the overall configuration of the organic EL display device 1 according to this embodiment. The organic EL display device 1 is a display device for use, for example, in a television set, a personal computer, a mobile terminal, a business display (an electronic signboard or a large display screen for a commercial facility), or the like.

The organic EL display device 1 includes an organic EL panel 10, and a drive control section 200 electrically connected thereto.

In this embodiment, the organic EL panel 10 is a top-transmission display panel, an upper surface of which is a rectangular image display screen. In the organic EL panel 10, a plurality of organic EL elements (not depicted) is arrayed along the image display screen, and the wavelengths of light emitted from the respective organic EL elements are selectively combined to display an image. It is to be noted that the organic EL panel 10 adopts, for example, an active matrix system.

The drive control section 200 has drive circuits 210 connected to the organic EL panel 10, and a control circuit 220 connected to an external device such as a calculator or an antenna-including receiver. The drive circuits 210 each have a power supply circuitry configured to supply electric power to the corresponding organic EL elements, a signal circuitry configured to generate voltage signals to control electric power to be supplied to the corresponding organic EL elements, a scanning circuitry configured to switch at predetermined intervals points to which the voltage signals are to be applied, and the like.

The control circuit 220 is configured to control operation of the drive circuits 210 according to data including image information and inputted from the external device or the receiver.

It is to be noted that, as an example, the drive circuits 210 are disposed as many as four around the organic EL panel 10 in FIG. 1 but the drive control section 200 is not limited to the exemplified configuration and the number and positions of the drive circuits 210 can be changed appropriately. For the sake of description, the direction along the long sides of the upper surface of the organic EL panel 10 will hereinafter be defined as an X-direction, and the direction along the short sides of the upper surface of the organic EL panel 10 will hereinafter be defined as a Y-direction, as indicated in FIG. 1.

2. Configuration of Organic EL Panel 10

(A) Configuration in Plan

Figure 2:
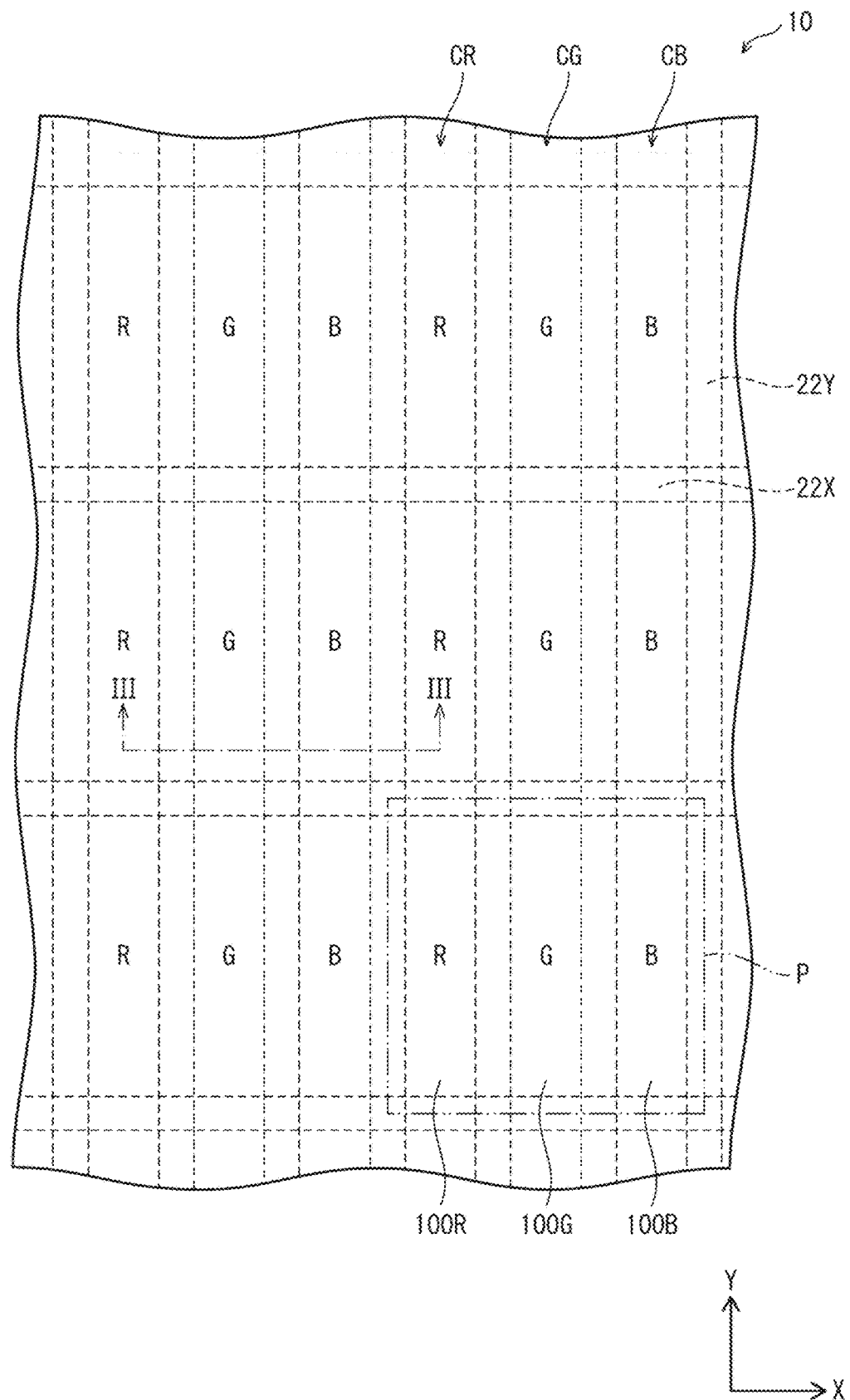
FIG. 2 is an enlarged fragmentary schematic plan view of an image display screen of an organic EL panel in the organic EL display device.

FIG. 2 is an enlarged fragmentary schematic plan view of the image display screen of the organic EL panel 10. As an example, subpixels 100R, 100G, and 100B which emit red (R) light, green (G) light and blue (B) light (hereinafter may also be called simply "R," "G," and "B"), respectively, are arrayed in a matrix pattern in the organic EL panel 10. The subpixels 100R, 100G, and 100B are repeatedly arranged side by side in this order in the X-direction, and each single group of subpixels 100R, 100G, and 100B arranged side by side in the X-direction configures a single pixel P.

At the pixel P, a full range of colors can be expressed through a combination of emission luminances of the subpixels 100R, 100G, and 100B under gradation control.

Along each column in the Y-direction, only the subpixels 100R, the subpixels G or the subpixels 100B are arrayed one by one, whereby a subpixel column CR, a subpixel column CG or a subpixel column CB is configured. Over the entirety of the organic EL panel 10, pixels P are arrayed in a matrix pattern along the X-direction and the Y-direction, and an image is displayed on the image display screen through a combination of emission colors of the pixels P arrayed in the matrix pattern.

In the subpixels 100R, 100G, and 100B, organic EL elements 2(R), 2(G), and 2(B) (see FIG. 3), which emit light in R, G and B colors, respectively, are disposed.

In this example, a so-called pixel bank system is adopted. Described specifically, each subpixel 100R, 100G or 100B is surrounded by associated column banks 22Y, which extend in the column direction (Y-direction), and row banks 22X, which extend in the row direction (X-direction).

It is to be noted that the column banks 22Y and the row banks 22X may hereinafter be referred to simply as "banks 22" without specifically distinguishing them from each other.

(B) Cross-Sectional Configuration

Figure 3:
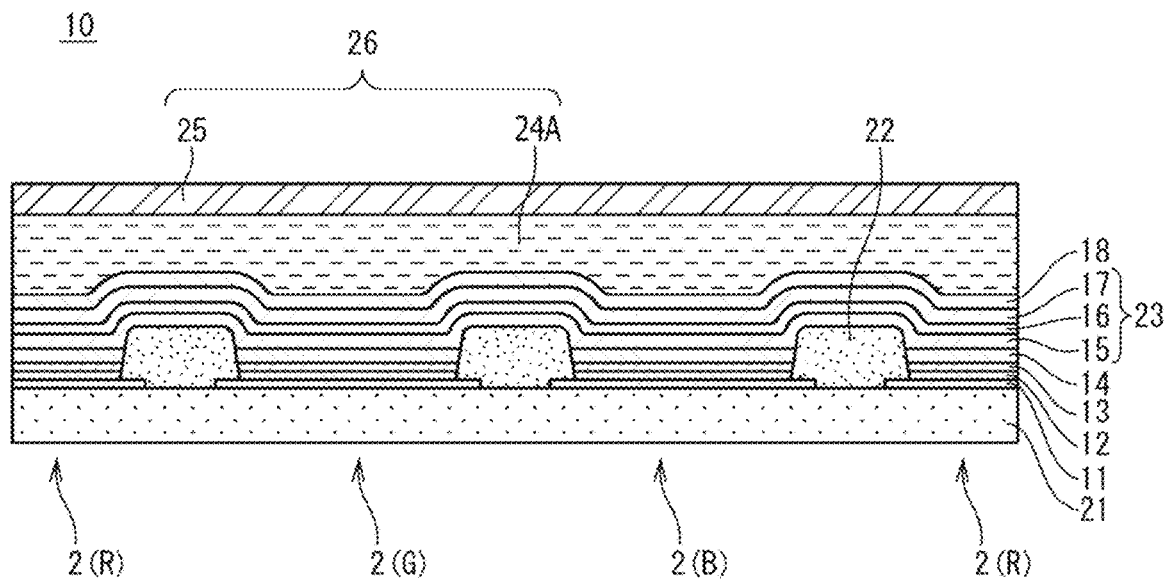
FIG. 3 is a schematic cross-sectional view along line III-III in FIG. 2.

FIG. 3 is a schematic cross-sectional view along line III-III in FIG. 2.

In the organic EL panel 10, each single pixel is formed from three subpixels that emit R, G and B, respectively, and each subpixel is configured of the organic EL elements 2(R), 2(G) and 2(B) that emit the corresponding colors.

The organic EL elements 2(R), 2(G) and 2(B) of the respective emission colors basically have a substantially similar configuration, and therefore will be described as an organic EL element 2 when they are not specifically distinguished from one another.

As illustrated in FIG. 3, the organic EL element 2 includes a substrate 21, a pixel electrode (anode) 11, a hole injection layer 12, a hole transport layer 13, an organic light-emitting layer 14, banks 22, an electron transport layer 23, an opposite electrode (cathode) 18, a sealing portion 26, and the like.

In this embodiment, the substrate 21, the electron transport layer 23, the opposite electrode 18, the sealing portion 26, and the like are not formed for each subpixel, but are commonly formed for the plural organic EL elements included in the organic EL panel 10.

(1) Substrate 21

The substrate 21 is configured by forming a thin film transistor (TFT) layer as drive circuits for the individual organic EL elements 2 on a base substrate composed from an insulating material and further forming an interlayer insulating layer on the TFT layer. In the TFT layer, known drive circuits are formed for each subpixel.

As the base substrate, it is possible to adopt, for example, a glass substrate, a quartz substrate, a silicon substrate, a metal substrate of molybdenum sulfide, copper, zinc, aluminum, stainless steel, magnesium, iron, nickel, gold, silver, or the like, a semiconductor substrate of gallium arsenic or the like, or the like.

Especially in the case of a flexible organic EL panel, a plastic substrate is used. Examples of a specific material include various thermoplastic elastomers such as polyethylene, polypropylene, polyamides, polyimides (PI), polycarbonates, acrylic resins, polyethylene terephthalate (PET), polybutylene terephthalate, polyacetals, fluorine-containing resins, styrene-based resins, polyolefin-based resins, polyvinyl chloride resins, polyurethane resins, fluorinated rubbers and polyethylene chloride resins; epoxy resins, unsaturated polyesters, silicone resins, polyurethanes, and the like, and copolymers, polymer blends, polymer alloys and the like containing two or more of the above-exemplified materials as principal components. A base substrate formed from one of the above-exemplified materials or a laminate formed by laminating two or more of above-exemplified materials can be used.

The interlayer insulating layer is formed from an insulating resin material, and serves to flatten steps on the upper surface of the TFT layer. Examples of the resin material include positive photosensitive materials. Illustrative of such light-sensitive materials are acrylic resins, polyimide-based resins, siloxane-based resins, and phenol-based resins.

Although not illustrated in the cross-sectional view of FIG. 3, contact holes are formed for each subpixel through the interlayer insulating layer of the substrate 21.

(2) Pixel Electrodes 11

The pixel electrodes 11 are formed on the interlayer insulating layer of the substrate 21. The pixel electrodes 11 are disposed for the respective subpixels, and are electrically connected to the corresponding drive circuits in the TFT layer through the associated contact holes. The pixel electrodes 11 each include a metal layer formed from a light-reflective metal material, and acts as an anode in this embodiment.

Specific examples of the metal material having light reflectivity include silver (Ag), aluminum (Al), aluminum alloys, molybdenum (Mo), silver-palladium-copper alloys (APCs), silver-rubidium-gold alloys (ARAB), molybdenum-chromium alloys (MoCrs), molybdenum-tungsten alloys (Molds), nickel-chromium alloys (NiCrs), and the like.

Each pixel electrode 11 may be configured of the metal layer alone, but may also be formed into a stacked layer structure including a layer, which is composed from a metal oxide such as indium tin oxide (ITO) or indium zinc oxide (IZO), stacked on the metal layer.

(3) Banks 22

The banks 22 are formed on the substrate 21 in a state that each pixel electrode 11 is exposed at a region of an upper surface thereof and is covered at regions surrounding the exposed region.

The banks 22 are formed, for example, from an insulating organic material (e.g., an acrylic resin, polyimide resin, novolak resin, phenol resin, or the like). The banks 22 function as a structure to prevent applied inks from overflowing when the organic light-emitting layers 14 are formed by a coating process, or as a structure for allowing to mount a vapor deposition mask when the organic light-emitting layers 14 are formed by a vapor deposition process. In this embodiment, the banks 22 are formed from a resin material, and the material of the banks 22 can be, for example, a positive photosensitive material. Such photosensitive materials include acrylic resins, polyimide resins, siloxane resins, and phenol resins. In this embodiment, a phenol resin is used.

(4) Hole Injection Layers 12

The hole injection layers 12 are disposed on the respective pixel electrodes 11 to promote the injection of holes from the pixel electrodes 11 into the corresponding organic light-emitting layers 14. The hole injection layers 12 are formed, for example, from an oxide of silver (Ag), molybdenum (Mo), chromium (Cr), vanadium (V), tungsten (W), nickel (Ni) or iridium (Ir) or a conductive polymer material such as a mixture of polythiophene and polystyrenesulfonic acid (PEPOT). The hole injection layers 12 formed from such a metal oxide are large in work function, and therefore stably inject holes into the corresponding organic light-emitting layers 14.

(5) Hole Transport Layers 13

The hole transport layers 13 have a function to transport holes, which have been injected from the hole injection layers 12, to the corresponding organic light-emitting layers 14. The hole transport layers 13 are formed, for example, from a high molecular compound such as polyfluorene or a derivative thereof or a polyarylamine or a derivative thereof.

(6) Organic Light-Emitting Layers 14

The organic light-emitting layers 14 are formed in the corresponding openings 22a (see FIG. 7F, etc.) defined by the banks 22, and have a function to emit light of the respective colors R, G, and B through recombination of holes and electrons.

As materials for the organic light-emitting layers 14, known materials can be used. Specifically described, the organic light-emitting layers 14 may preferably be formed with fluorescent materials such as, for example, oxynoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, 8-hydroxyquinoline metal complexes, 2-bipyridine metal complexes, Schiff base-Group-III metal complexes, oxine-metal complexes, and rare earth complexes.

(7) Electron Transport Layer 23

The electron transport layer (function layer) 23 has a function to inject and transport electrons, which have been supplied from the opposite electrode 18, to the side of the organic light-emitting layers 14, and in this embodiment, has a three-layered structure formed by stacking a first layer portion 15, a second layer portion 16 and a third layer portion 17 successively from the side of the organic light-emitting layers 14.

The layer portions have configurations that they each contain as a host material an organic material having electron transport property and/or electron injection property, the first layer portion 15 as a lowermost layer and the third layer portion 17 as an uppermost layer are doped with a metal of a low work function by a predetermined amount, and the second layer portion 16 as a middle layer is not doped with the metal. For details, a description will be given subsequently herein.

Examples of the organic material (host material) having electron transport property and/or electron injection property include, but are not limited to, low molecular organic n-electron system materials such as oxadiazole derivatives (OXDs), triazole derivatives (TAZs), and phenanthroline derivatives (BCP, Bphen).

As the metal of the low work function, one or more metals selected from the group of metals belonging to the alkali metal group, the alkaline earth metal group and the rare earth metal (lanthanoid) group (hereinafter called "the alkali metals and the like"). Among these, in particular, Er, Tm, Yb, and the like, which are rare earth metals having a large ionization energy and are positioned on the right-hand side (on the side with large atomic numbers) in the Periodic Table, are more desired for their high stability and oxidation resistance.

(8) Opposite Electrode 18

The opposite electrode 18 is formed from a transparent conductive material, and is formed on the electron transport layer 23. The opposite electrode 18 functions as a cathode.

As the opposite electrode 18, a metal thin film or a transparent conductive film of ITO, IZO, or the like can be used, for example. To more effectively obtain an optical resonator structure, it is desired to form a metal thin film by using, as a material for the opposite electrode 18, at least one material out of aluminum, magnesium, silver, aluminum-lithium alloys, magnesium-silver alloys, and the like. In this case, the metal thin film may desirably be set to have a thickness of 5 nm or greater and 30 nm or smaller.

Additionally, a transparent conductive film of ITO, IZO, or the like may be similarly formed on the opposite electrode 18, thereby adjusting the chromaticity and viewing angle.

(9) Sealing Portion 26

On the opposite electrode 18, the sealing portion 26 is formed to suppress deteriorations of the organic light-emitting layer 14, the electron transport layer 23 and the like through their contact to water, oxygen, and the like.

The sealing portion 26 includes a resin sealing layer 24A formed on the opposite electrode 18 and composed from a resin material, and a glass sealing layer 25 formed on the resin sealing layer 24A.

As the resin material for the resin sealing layer 24A, an ultraviolet-curable resin having translucency can be used, for example. The ultraviolet-curable resin has a high curing rate, and therefore can shorten working time. The ultraviolet-curable resin does not cure if ultraviolet rays are not irradiated, and therefore has advantages that there is no much restriction to a coating step and low-temperature curing is possible. Usable examples of the ultraviolet-curable resin include acrylate resins and epoxy resins.

In some instances, however, a thermosetting resin may also be used. Examples of the thermosetting resin include UF (Urea Formaldehyde) urea resins, MF (Melamine Formaldehyde) melamine resins, epoxy resins, phenol resins, and the like.

The glass sealing layer 25 is formed from a glass sheet having transparency.

<Evaluation of Organic EL Element>

An evaluation experiment was next conducted about changes with time in the driving voltage for the organic EL element according to the embodiment.

Figure 4:
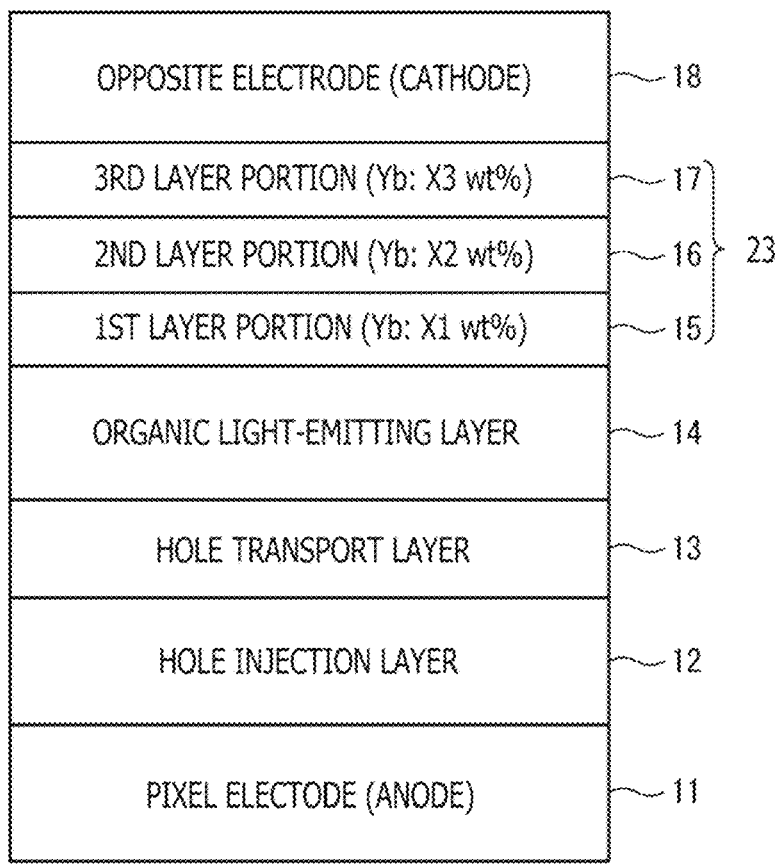
FIG. 4 is a fragmentary view schematically illustrating a stacked structure of an organic EL element according to a first aspect of this disclosure.

FIG. 4 is a view schematically illustrating the stacked structure from the pixel electrode 11 to the opposite electrode 18 in the organic EL element as a target of evaluation. As the dopant metal in the electron transport layer 23, Yb was used as an example.

In the organic EL element 2 (embodiment sample) as the target for evaluation, the hole injection layer 12, the hole transport layer 13, the organic light-emitting layer 14, the electron transport layer 23 (the first layer portion 15, the second layer portion 16, and the third layer portion 17), and the opposite electrode (cathode) 18 were successively stacked on the pixel electrode (anode) 11.

The host materials in the first layer portion 15 to the third layer portion 17 of the electron transport layer 23 were composed of the same organic material having electron transport property, and the respective layer portions were all set to have a thickness of 10 nm. Further, only the first layer portion 15 and the third layer portion 17 were doped with Yb at a concentration of 20 wt %, and the middle second layer portion 16 was not doped with any metal.

As comparison samples 1 and 2, those which were each different only in the structure of the electron transport layer from the above-described embodiment sample were fabricated. Described specifically, the electron transport layer of the organic EL element as the comparison sample 1 was in the form of a single layer having a thickness of 30 nm, and was doped with Yb at 20 wt %. Meanwhile, the electron transport layer of the organic EL element as the comparison sample 2 had a two-layer structure, the layer on the side of the organic light-emitting layer 14 had a thickness of 15 nm and was doped with Yb at a concentration of 20 wt %, and the layer on the side of the opposite electrode 18 had a thickness of 15 nm and was doped with Yb at a concentration of 10 wt %.

The thickness of the electron transport layer in each of the comparison samples 1 and 2 was the same as the total thickness of the three layers of the electron transport layers 23 in the embodiment sample.

The embodiment sample and the comparison samples 1 and 2 were each driven continuously, and measured for a driving voltage increment ($\Delta V$) from the starting time of the driving. As accelerated experiments were conducted in this example, the environmental temperature was set at 85° C.

Figure 5:
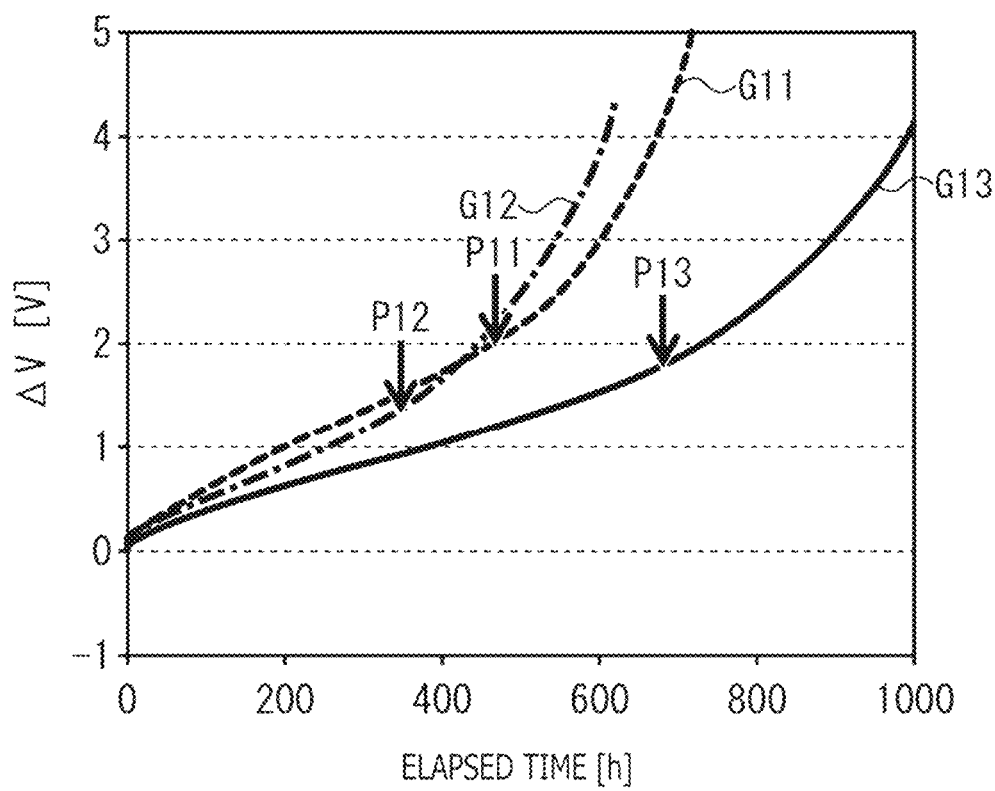
FIG. 5 is a graph illustrating effects for the suppression of a rise in driving voltage in the organic EL element according to the first aspect of this disclosure in comparison with cases in which electron transport layers are formed of a single layer and two layers, respectively.

The graph of FIG. 5 illustrates the results of the above experiments, the axis of abscissas represents the elapsed time [h] from the starting time of driving, and the axis of ordinates represents the driving voltage increment ($\Delta V$ [V]) from the starting time of driving. In the graph, lines G11, G12, and G13 indicate the experimental results of the comparison sample 1, the comparison sample 2, and the embodiment sample. Further, arrows P11, P12, and P13 on the individual lines G11, G12, and G13 indicate positions (inflection points) where the driving voltage turned to rise abruptly. In FIG. 5, "ETL" is an abbreviation of "electron transport layer."

As is seen from the experimental results of FIG. 5, in the comparison sample 2 (G12) in which the electron transport layer had the two-layer structure, the total doping amount of Yb in the electron transport layer was ¾ of that of Yb in the comparison sample 1, so that the remaining amount of the unoxidized dopant metal decreased earlier and the driving voltage arose at an earlier stage than that for the comparison sample 1 (G11).

In the embodiment sample (G13), however, it is appreciated that the rise in driving voltage was much slower compared with those in the comparison samples 1 and 2 despite the overall doping amount of Yb was further smaller than that in the comparison sample 2 (⅔ of the doping amount in the comparison sample 1, ⅚ of the doping amount in the comparison sample 2). According to the embodiment sample, it is therefore possible to provide an organic EL element with a prolonged service life and also to contribute to a reduction in manufacturing cost because of the use of relatively expensive Yb in a smaller amount.

These experimental results are considered to be obtained because the moving quantities and rates of water and oxygen through the electron transport layer largely depend not only on the potential gradient in the thickness direction of the electron transport layer but also on the state of distribution of the dopant metal.

Described specifically, as the reason, it is considered that an alkali metal or the like to be doped in an electron transport layer tends to be converted into positive ions (cations) and, if the alkali metal or the like exists at a certain concentration or higher continuously in the thickness direction of the electron transport layer as in the comparison samples 1 and 2, Coulomb force arises between such positive ions and oxygen ions ($O^{2-}$) and hydroxide ions ($OH^-$) (hereinafter collectively referred to as "oxygen ions and the like"), oxygen ions and the like are increasingly pulled into the inside of the electron transport layer to accelerate the penetration rate of oxygen ions and the like, and eventually reach an interface with the organic light-emitting layer 14 to cause oxidation of the dopant metal even around the interface.

According to the embodiment sample, however, the doping concentrations of the alkali metal or the like in the first layer portion 15 as the lowermost layer and the third layer portion 17 as the uppermost layer in the electron transport layer 23 are at a predetermined value or higher, and the second layer portion 16 (non-doped layer) not doped with the alkali metal or the like is interposed between both of them. It is therefore considered that (i) oxygen ions and the like penetrated from the outside into the third layer portion 17 of the electron transport layer first reacted with the dopant metal contained at the predetermined concentration in the third layer portion 17, and hence the number of oxygen ions and the like decreased there, (ii) even if oxygen ions and the like which remained without reaction with the dopant metal in the third layer portion 17 reached the interface between the third layer portion 17 and the second layer portion 16, the second layer portion 16 was a non-doped layer, and hence electrical pulling force by the dopant metal contained in the third layer portion 17 was cut off to result in a loss of the moving rate of oxygen ions and the like, and (iii) as a consequence, a great deal of time was required for oxygen ions and the like to pass through the second layer portion 16 and then to reach the first layer portion 15, the oxidation of the dopant metal in the first layer portion 15 was also delayed, and the rise in driving voltage became gentle as indicated by line G13 in FIG. 5.

To effectively cut off the pulling force of the dopant metal in the first layer portion 15 for oxygen ions and the like penetrated into the third layer portion 17 as described above, the non-doped layer (the second layer portion 16) as the middle layer desirably has a thickness of 5 nm or greater.

Meanwhile, the first layer portion 15 and the third layer portion 17 are not needed to be the same in thickness or the doping concentration of the alkali metal or the like. Desirably, however, they each have a thickness of 5 nm or greater and 30 nm or smaller, and a doping concentration of 10 wt % or higher and 60 wt % or lower.

As a reason, if the doping concentration is lower than 10 wt %, the electron injection property cannot be obtained to a required level, and if the doping concentration exceeds 60 wt %, a luminous flux generated in the organic light-emitting layer 14 is absorbed to result in a reduced transmittance and hence in a lowered light extraction efficiency.

More desirably, the thickness is 20 nm or greater and 25 nm or smaller, and the doping concentration is 20 wt % or higher and 50 wt % or lower.

However, the first layer portion 15 and the third layer portion 17 are not required to have the same thickness and/or doping concentration. Their thicknesses and doping concentrations are also determined according to the specification required for the electron transport layer 23 by a design (especially, the optical thickness of the electron transport layer as needed upon construction of an optical resonator structure) and the like, so that the upper limit of the thickness of the second layer portion 16 and the thicknesses and doping concentrations of the first layer portion 15 and the third layer portion 17 are specifically determined within the above-mentioned ranges.

As also described with reference to FIG. 15D, an increase in energy barrier primarily at the interface between an electron transport layer and an organic light-emitting layer significantly affects a rise in driving voltage. It is therefore considered desirable to set the doping concentration of the first layer portion 15, which is on the side of the organic light-emitting layer, higher than that of the third layer portion 17.

<Manufacturing Process of Organic EL Element>

For a fabrication process of the organic EL element 2, a description will hereinafter be given with reference to the relevant drawings.

Figure 6:
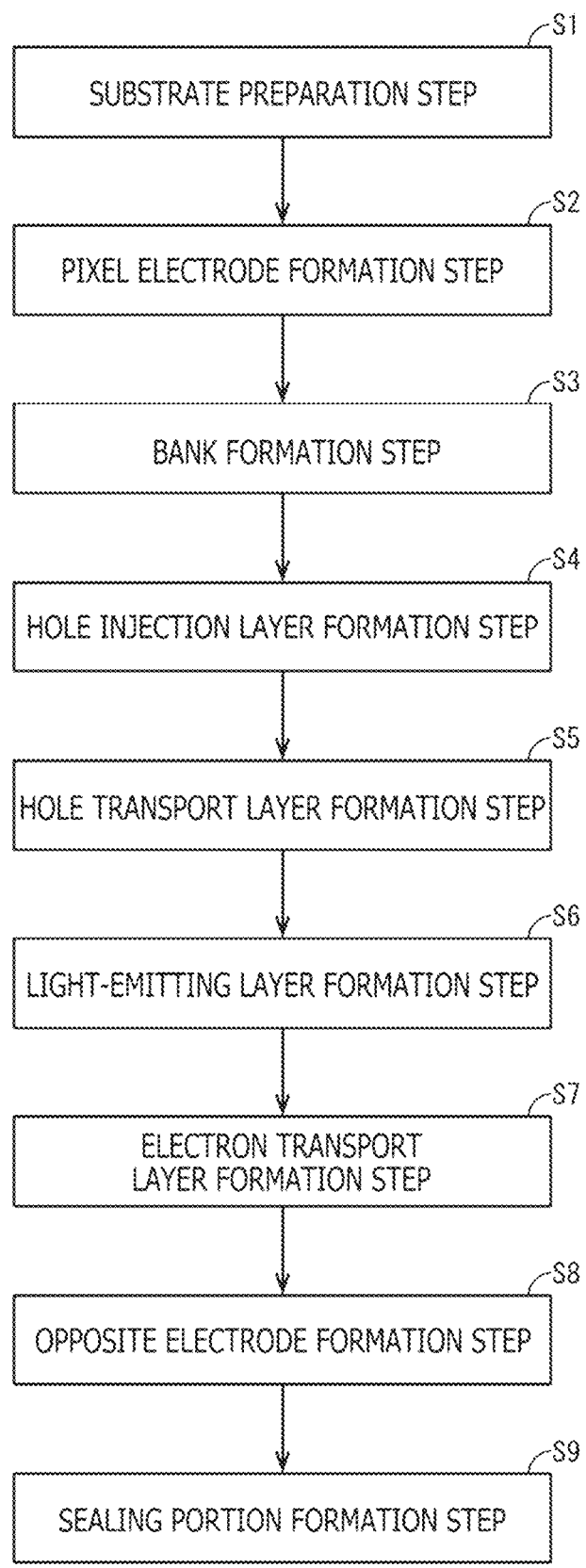
FIG. 6 is a flow chart illustrating an example of a manufacturing process of the organic EL element according to the first aspect of this disclosure.

FIG. 6 is a flow chart illustrating the procedures of manufacturing steps of the organic EL element 2. FIGS. 7A through 9B are cross-sectional views schematically illustrating the courses of manufacture of the organic EL element 2.

(1) Substrate Preparation Step (FIG. 6: Step S1)

Figure 7A:
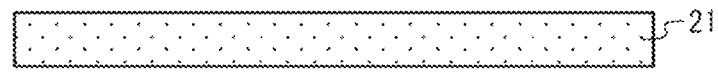
FIGS. 7A through 7F are fragmentary cross-sectional views schematically illustrating steps S1 to S6 in the manufacturing process of the organic EL element according to the first aspect of this disclosure.

A TFT layer is formed on a base substrate by a known TFT fabrication process, and an interlayer insulating layer is formed on the TFT layer to prepare the substrate 21 (FIG. 7A).

The interlayer insulating layer is formed by applying a resin material, which has a certain degree of flowability, for example, by a die coating process such that the resin material eliminates roughness on the TFT layer. As a consequence, the interlayer insulating layer is provided at an upper surface thereof with a shape planarized along an upper surface of the base substrate.

Further, contact holes (not illustrated) are formed by applying a dry etching process to the interlayer insulating layer at positions, for example, above source electrodes of the respective TFT elements. The contact holes are formed using patterning or the like such that surfaces of the source electrodes are exposed at bottom portions of the contact holes.

Next, connection electrode layers are formed along inner walls of the contact holes. Upper portions of the connection electrode layers are disposed at parts thereof on an upper surface of the interlayer insulating layer. For the formation of the connection electrode layers, a sputtering process can be used, for example. After forming a metal film, patterning can be performed using a photolithography process and a wet etching process.

(2) Pixel Electrode Formation Step (FIG. 6: Step S2)

Figure 7B:
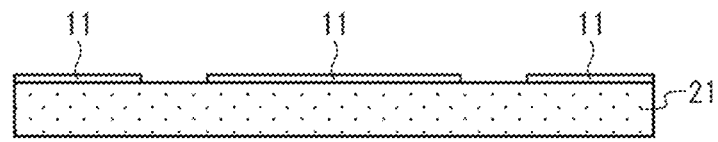

As illustrated in FIG. 7B, the pixel electrodes 11 are next formed on the substrate 21.

For this purpose, a thin film composed from a pixel electrode material is first formed on the substrate 21 by using, for example, a vacuum evaporation process or a sputtering process, and thereafter is patterned by etching to form the pixel electrodes 11 divided for each subpixel.

(3) Bank Formation Step (FIG. 6: Step S3)

Figure 7C:
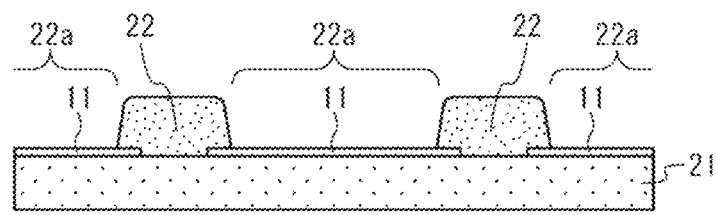

A bank resin as a material for the banks 22 is then uniformly applied on the pixel electrodes 11 to form a bank material layer. As the bank resin, a phenol resin which is a positive photosensitive material is used, for example. Exposure and development is applied to the bank material layer to form a pattern in the form of the banks 22, followed by heating to form the banks 22 (FIG. 7C). This heating is conducted, for example, at a temperature of 150° C. or higher and 210° C. or lower for 60 minutes. By the banks 22 so formed, the openings 22a to be used as regions for the formation of the organic light-emitting layers 14 are defined.

(4) Hole Injection Layer Formation Step (FIG. 6: Step S4)

Figure 7D:
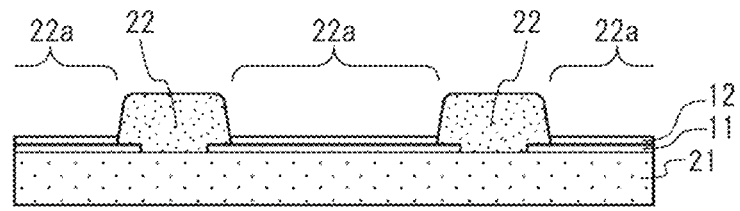

A material for the hole injection layers 12 is formed into layers in the respective openings 22a by a mask vapor deposition process or by an inkjet coating process, whereby the hole injection layers 12 are formed as illustrated in FIG. 7D.

(5) Hole Transport Layer Formation Step (FIG. 6: Step S5)

Figure 7E:
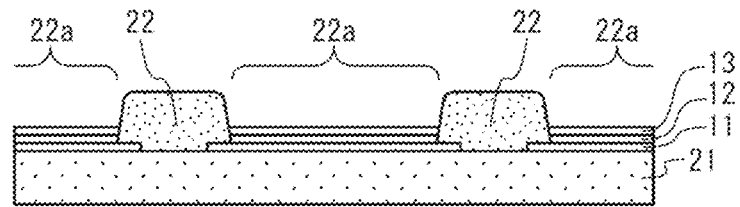

An ink, which contains component materials for the hole transport layers 13, is next applied onto the hole injection layers 12 in the respective openings 22a, and is formed into the hole transport layers 13 through heating (drying) as illustrated in FIG. 7E.

(6) Light-Emitting Layer Formation Step (FIG. 6: Step S6)

Figure 7F:
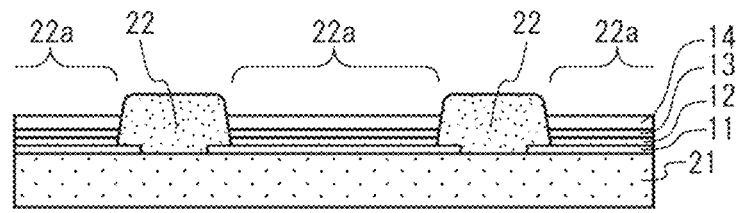

Inks, which contain organic light-emitting materials of emission colors corresponding to the respective openings 22a, are next successively ejected by a printing machine, whereby the inks are applied onto the hole transport layers 13 in the corresponding openings 22a (FIG. 7F).

The substrate 21 with the inks applied thereto are then placed in a vacuum drying chamber and heated under a vacuum environment, so that an organic solvent in the inks is caused to evaporate to form coating films of the light-emitting materials. Thus, the organic light-emitting layers 14 can be formed.

In the completed product of each organic EL panel, observations of the surface shapes of some of its organic light-emitting layers enable to discriminate whether or not the organic light-emitting layers are coating films, because as already mentioned, when an ink with a light-emitting material contained therein is dried after coating, the ink tends to become dry earlier at positions where the ink is in contact with banks, and therefore the thickness of a central portion of the organic light-emitting layer in each subpixel becomes a little smaller than those of portions in contact with the banks.

Nonetheless, the organic light-emitting layers 14 can also be formed by a dry process such as a mask vapor deposition process.

(7) Electron Transport Layer Formation Step (FIG. 6: Step S7)

Next, the electron transport layer 23 is formed.

Figure 8A:
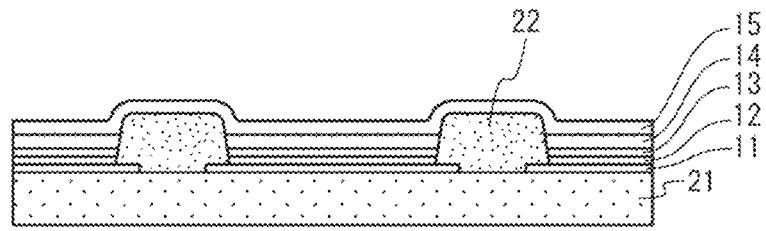
FIGS. 8A to 8D are fragmentary cross-sectional views schematically illustrating manufacturing steps of the organic EL element, which follow the step of FIG. 7F.

Commonly to the individual subpixels, an electron-transporting organic material and Yb as a dopant metal are first formed into a layer on the organic light-emitting layers 14 by a co-deposition process, whereby the first layer portion 15 is formed (FIG. 8A). The first layer portion 15 has a thickness of, for example, 10 nm, and is doped with Yb at 20 wt %, for example.

Figure 8B:
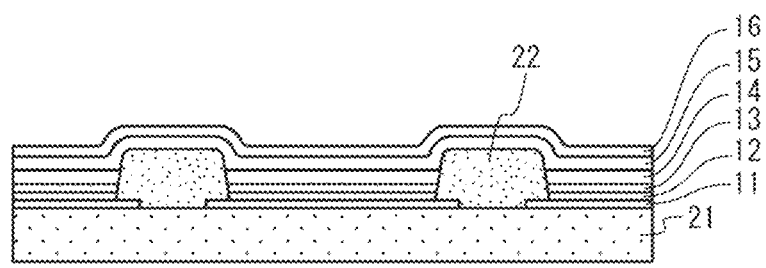

On the first layer portion 15, only the organic material having electron transport property is deposited by vacuum evaporation to form the second layer portion 16 of, for example, 10 nm in thickness. In the second layer portion 16, Yb is not doped (FIG. 8B).

Figure 8C:
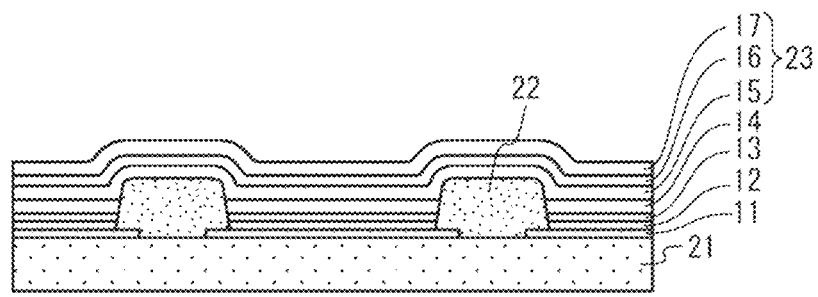

Commonly to the individual subpixels, the electron-transporting organic material and Yb are further deposited on the second layer portion 16 by the vacuum evaporation process, whereby the third layer portion 17 is formed, for example, at a thickness of 10 nm and a Yb-doping concentration of 20 wt % (FIG. 8C).

As a consequence, the electron transport layer 23 of the three-layer structure is formed.

In the co-deposition process, for example, two evaporation sources configured to separately evaporate the organic material and Yb are arranged in a vacuum chamber set in a high vacuum environment, and the evaporation sources are provided with shutters, respectively. By controlling the open time periods of the respective shutters and the heating temperatures of the evaporation sources, the thickness and doping concentration can be adjusted as desired.

Upon formation of the second layer portion 16, only the shutter of the evaporation source for the organic material should be opened, and the shutter of the evaporation source for Yb should be maintained closed.

If the electron transport layer 23 composed of the plural layers is formed by a co-deposition process in the same vacuum chamber as in this example, the boundaries between the respective adjacent two layer portions in the first layer portion 15 to the third layer portion 17 may not always be exactly defined depending on the open time periods of the shutters and the heating temperatures of the individual evaporation sources. For example, the doping concentrations of Yb or the concentrations of the organic material in portions, which correspond to the respective boundaries between the first layer portion 15 and the second layer portion 16 and between the second layer portion 16 and the third layer portion 17, may continuously change in the thickness direction or may have concentration gradients.

Nonetheless, the electron transport layer 23 can be considered to have the three-layer structure as a whole, because the thicknesses of the portions where such concentration gradients or the like arise (hereinafter called "boundary equivalent portions") are extremely small compared with the thickness of the whole electron transport layer 23.

Practically, however, because the doping concentrations of the first layer portion 15 and the third layer portion 17 are considered desirable to be 10 wt % or higher and 60 wt % or lower as mentioned above, the thickness ranges or the like of the first layer portion 15 and the third layer portion 17 may desirably be specified assuming that parts of the respective boundary equivalent portions, the parts each having a Yb-doping concentration of 10 wt % or higher, are included in the first layer portion 15 and the third layer portion 17 to which the boundary equivalent portions are adjacent. This also applies equally to a case that the electron transport layer 23 is formed by stacking four layers or more.

(8) Opposite Electrode Formation Step (FIG. 6: Step S8)

Figure 8D:
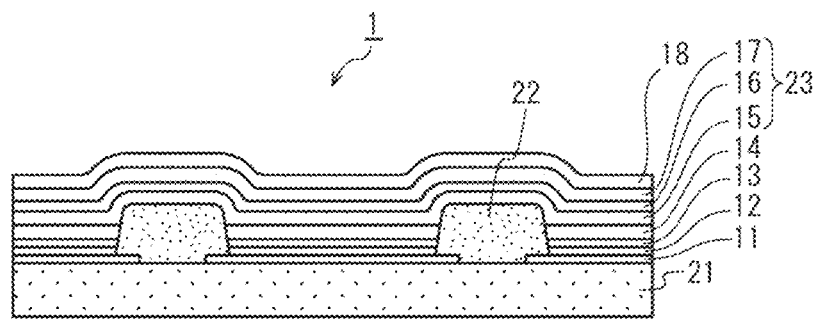

As illustrated in FIG. 8D, the opposite electrode 18 is formed on the electron transport layer 23. In this embodiment, the opposite electrode 18 is formed through deposition of silver, aluminum, or the like by a sputtering process or a vacuum evaporation process. As an alternative, a transparent conductive film of ITO, IZO, or the like can also be formed by vacuum deposition.

(9) Sealing Portion Formation Step (FIG. 6: Step S9)

The sealing portion 26 is formed of the resin sealing layer 24A and the glass sealing layer 25 stacked together.

Figure 9A:
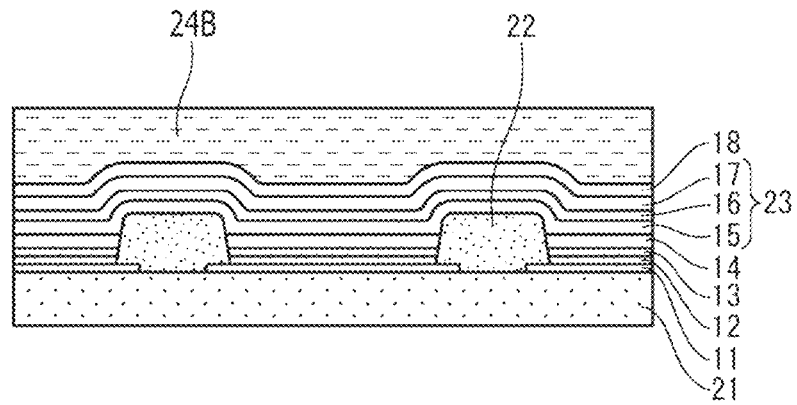
FIGS. 9A and 9B are fragmentary cross-sectional views schematically illustrating manufacturing steps of the organic EL element, which follow the step of FIG. 8D.
Figure 9B:
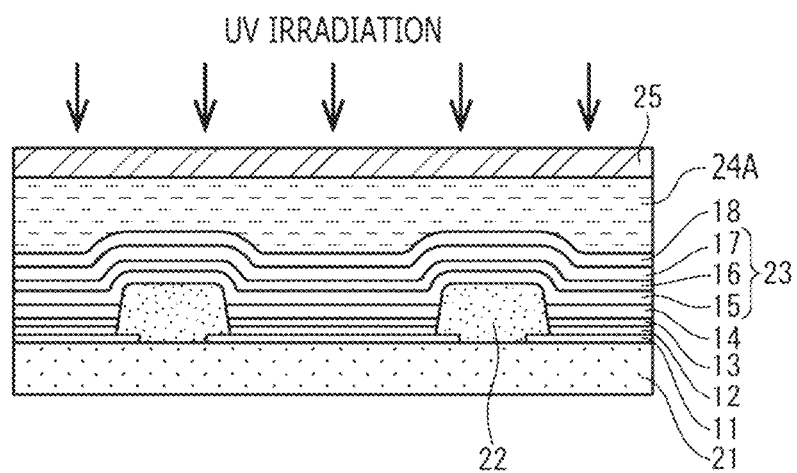

A liquid ultraviolet curable resin is first applied on the opposite electrode 18 by a spin coating process or the like to form a resin material layer 24B (FIG. 9A). After a glass sheet is placed as the glass sealing layer 25 on the resin material layer 24B, ultraviolet rays are irradiated from above to the resin material layer 24B via the glass sealing layer 25, so that the resin material layer 24B is cured.

As a consequence, the resin sealing layer 24A is formed, and in addition, the glass sealing layer 25 is bonded on the opposite electrode 18 via the resin sealing layer 24A.

The glass sheet is resistant to transmission of air and water and is also resistant to discoloration, and therefore is suited as a sealing material for top-emission organic EL panels.

When forming a flexible organic EL panel, however, a film composed from a resin material such as, for example, a polyether sulfone (PES) or a polycarbonate (PC) can be used instead of a glass sheet.

Through the foregoing steps, an organic EL panel is completed including a plurality of organic EL elements.

The above-described manufacturing process is merely illustrative, and can be changed appropriately.

<Summary of Advantageous Effects of Embodiment>

(1) As described above, an alkali metal or the like of a low work function has an excellent characteristic of improving electron injection property when doped in an electron transport layer, and also has an action to pull oxygen ions and the like inside owing to its high activity.

Therefore, in the organic EL element according to the first aspect of this disclosure, the electron transport layer is configured in a three-layer structure formed from the first to third layer portions, the doping concentrations of the alkali metal or the like in the first layer portion and the third layer portion are set at the predetermined level or higher to improve the electron injection property at the parts thereof where they are adjacent to the organic light-emitting layer and the opposite electrode, respectively, and the second layer portion as the middle layer is left undoped with the alkali metal or the like that is also effective in pulling oxygen ions and the like.

As a consequence, even if water and oxygen begin to penetrate from the outside, they can first react with the dopant metal contained in the third layer portion to decrease the number of oxygen ions and the like, and the movement of the remaining oxygen ions and the like can be stemmed and delayed in the second layer portion which is a non-doped layer. Hence, the oxidation of the alkali metal or the like doped in the first layer portion can be delayed correspondingly, thereby preventing an abrupt rise in driving voltage which would otherwise occur due to a reduction in electron injection property from the electron transport layer into the organic light-emitting layer. It is therefore possible to make the service life of the organic EL element longer than the conventional configuration.

(2) According to a wet process that forms organic layers by printing inks, in which organic materials are separately dissolved in an organic solvent, at necessary positions by a printing machine or the like, the cost of manufacturing equipment can be suppressed even for large organic EL panels and the percentage of material utilization is high. The wet process is therefore superior in cost to dry processes such as the vacuum evaporation process. As described with reference to FIG. 16, however, if a light-emitting layer is formed by the wet process, the thickness becomes inevitably small at a center portion in each subpixel, and a current concentrates at the central portion to accelerate the oxidation of the dopant metal there in the electron transport layer. This accelerated oxidation has been a cause of an abrupt rise in driving voltage. By configuring the electron transport layer in a three-layer structure and leaving the middle layer as a non-doped layer as in the first aspect of this disclosure, the penetration of oxygen ions and the like into the first layer portion in a proximity of the light-emitting layer can be stemmed, and a prolongation of service life can be achieved.

In addition, the material cost can also be saved because, if the thickness and the doping concentration of the electron transport layer are the same as in the past case that the single layer is doped in its entirety, the amount of the dopant metal decreases by the amount of the dopant, which would otherwise be needed for the undoped second layer portion.

In other words, according to the above-described aspect of this disclosure, an organic light-emitting layer is formed by a wet process. It is hence possible to save the material cost for the dopant metal while cutting down the manufacturing cost, and also to provide an organic EL element with a longer service life than that available from the configuration in the past.

<<Modifications>>

As various aspects of this disclosure, the embodiments of the organic EL element and the manufacturing process of the organic EL elements have been described above. However, this disclosure should not be restricted by the above-described embodiments except for its essential characteristic features. Other aspects of this disclosure will hereinafter be described as modifications.

(1) In the above-described embodiments, the electron transport layer 23 is configured in a three-layer structure, and its second layer portion 16 as the middle layer is configured as a non-doped layer. However, the second layer portion 16 may not absolutely be required to be in a state that it is not doped at all with an alkali metal or the like.

As a reason, if the doping concentration of the alkali metal or the like in the second layer portion is lower than those in the first layer portion and the third layer portion, the second layer portion has a more or less effect to stem the penetration of oxygen ions and the like into the first layer portion close to the organic light-emitting layer compared with at least the past case that the electron transport layer is a single layer and is evenly doped with a dopant metal at a concentration equal to or higher than the concentration at which electron injection property is ensured.

(2) In the above-described embodiments, the same organic material is used as the host materials for the individual layers in the electron transport layer 23. It is, however, not absolutely necessary to use the same organic material. For example, a material excellent in electron injection property may be used in the first layer portion 15 and the third layer portion 17 which are adjacent to the organic light-emitting layer 14 and the opposite electrode 18, respectively, and another material excellent in electron transport property may be used in the second layer portion 16 as the middle layer.

In particular, the second layer portion 16 is a middle layer, and is not in contact with another material of a different LUMO level at both the upper and lower interfaces thereof. Therefore, an importance is placed on electron transport property rather than electron injection property.

Further, the dopant metal is not limited to a single kind, but a plurality of two or more kinds of dopant metals may be allowed to exist together. It is not absolutely necessary to make the dopant metal the same in the first layer portion 15 and the third layer portion 17.

(3) In addition, insofar as the electron transport layer has a multilayer structure, the electron transport layer is not limited to a three-layer structure but may be in a structure of four or more layers.

Figure 10:
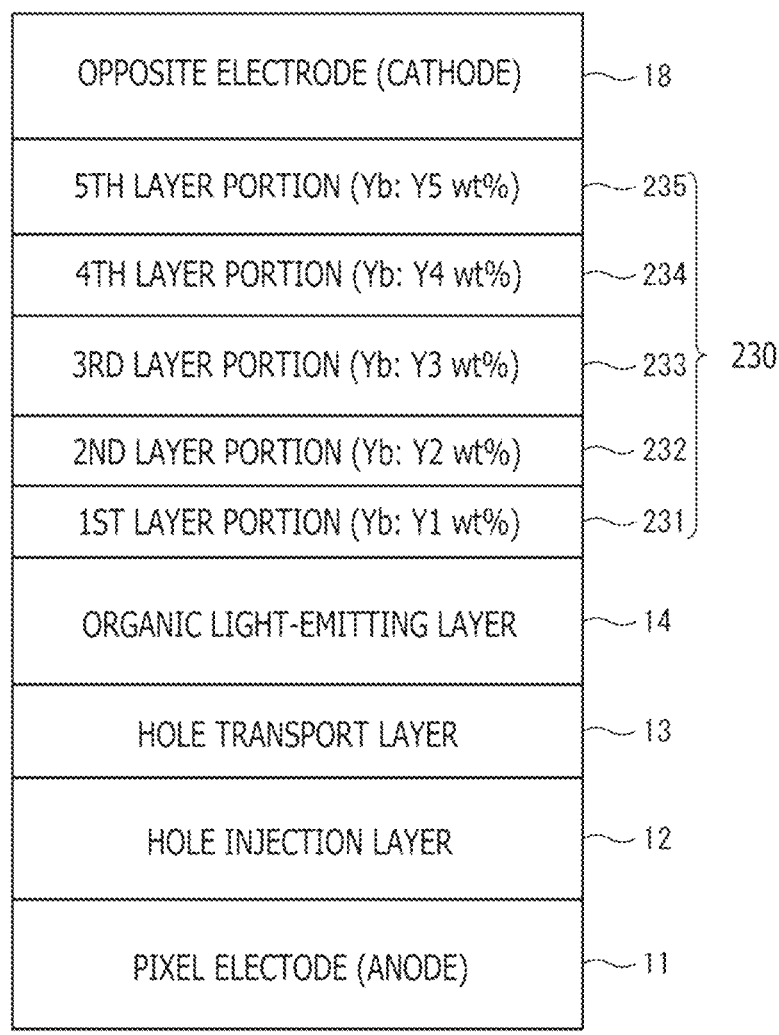
FIG. 10 is a view illustrating another example of the stacked structure of the electron transport layer in the organic EL element according to the first aspect of this disclosure.

FIG. 10 is a view schematically illustrating the stacked structure of an organic EL element in which an electron transport layer has a five-layer structure, and illustration of the substrate 21 and the sealing portion 26 is omitted.

As illustrated in the figure, in this modification, the electron transport layer 230 is formed from five layers including a first layer portion 231 to a fifth layer portion 235. Although a little exaggerated in FIG. 10, the combined total thickness of the first to fifth layer portions 231 to 235 may be the same as the thickness of the electron transport layer 23 in the embodiments.

Assuming that the doping concentrations of the alkali metal or the like in the individual first layer portion 231 to the fifth layer portion 235 are Y1 wt % to Y5 wt %, respectively, in this order, the doping concentrations Y2 wt % to Y4 wt % of the second layer portion 232 to the fourth layer portion 234, which are intermediate layers interposed between the uppermost layer and the lowermost layer, are all smaller than the doping concentration Y1 wt % of the first layer portion 231 and the doping concentration of Y5 wt % of the fifth layer portion 235, so that these intermediate layers have effects to delay the penetration rate of oxygen ions and the like. It is therefore possible to delay the oxidation of the dopant metal in the first layer portion 231 adjacent to the organic light-emitting layer 14, and hence to achieve a prolongation of the organic EL element.

No particular limitation is imposed on the mutual high/low relationship in doping concentration among the second layer portion 232 to the fourth layer portion 234 as the intermediate layers. Obviously, however, a non-doped layer is desirably included as at least one of these intermediate layers.

(4) In the above-described embodiments, the electron transport layer 23 is formed directly on the organic light-emitting layer 14. Especially when forming the hole transport layer 13, the organic light-emitting layer 14, and the like by a wet process, there is a possibility that impurities such as water may remain in the hole transport layer 13 and the organic light-emitting layer 14. These impurities have a possibility to react with the dopant metal in the first layer portion 15 of the electron transport layer 23, the first layer portion 15 being adjacent to the organic light-emitting layer 14, and to deteriorate the electron injection property.

Figure 11:
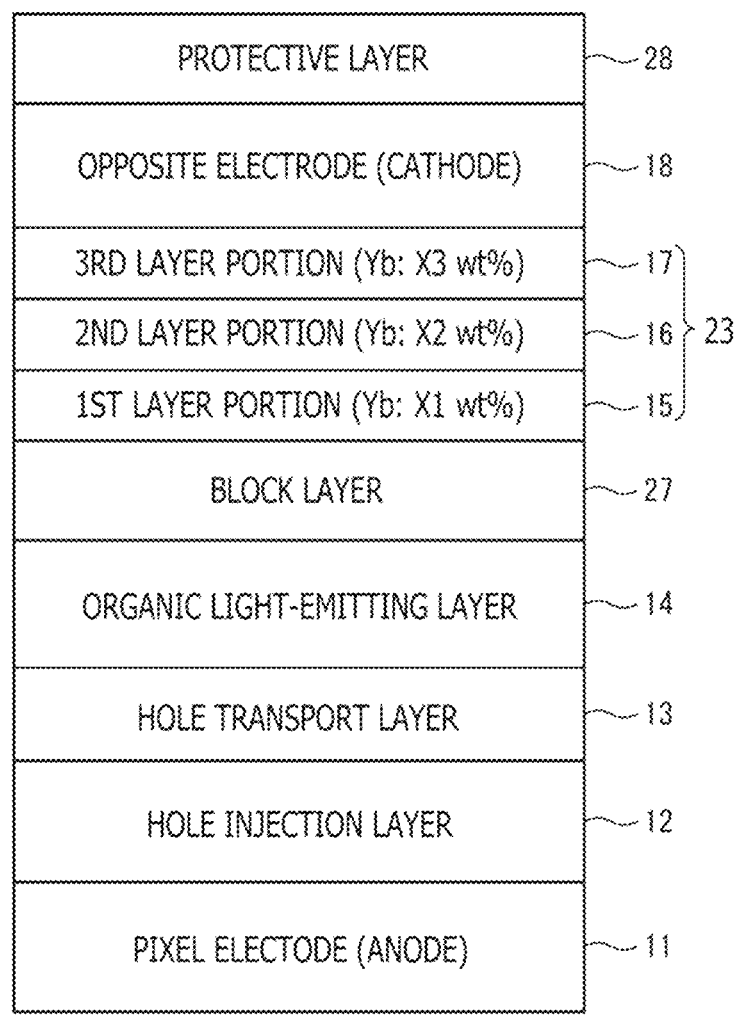
FIG. 11 is a view illustrating a further example of the stacked structure of the electron transport layer in the organic EL element according to the first aspect of this disclosure.

FIG. 11 is a view schematically illustrating the stacked structure of an organic EL element according to another modification, and illustration of the substrate 21 and the sealing portion 26 is omitted.

As illustrated in the figure, a block layer 27 is formed between the organic light-emitting layer 14 and the electron transport layer 23 in this modification. This block layer 27 is composed from a material, which is resistant to the passage of impurities, such as an alkali metal fluoride, and is formed by a vapor deposition process commonly for each organic EL element.

Among alkali metal fluorides, sodium fluoride (NaF) is particularly good in blocking ability against impurities such as water.

Such alkali metal fluorides have an advantage that impurities are difficult to pass, while involving a negative implication of inferior electron injection property. However, an alkaline earth metal or rare earth metal, such as Ba or Yb doped in the first layer portion 15, has strong reducing power and a property to cleave the bond in the fluoride. By setting the thickness of the block layer 27 at 1 nm to 5 nm, the block layer 27 can ensure necessary electron injection property while exhibiting blocking effects for the prevention of penetration of impurities from the organic light-emitting layer.

Accordingly, the interposition of the above-described block layer 27 between the organic light-emitting layer 14 and the electron transport layer 23 can suppress a deterioration of the electron injection property of the electron transport layer 23, which is caused by water contained in the organic light-emitting layer 14 and the hole transport layer 13 in the organic EL element, and can also achieve a prolongation of the organic EL element while reducing the manufacturing cost through the formation of these organic layers by a wet process.

In the above-described embodiment, the resin sealing layer 24A is formed directly on the electron transport layer 23 as illustrated in FIG. 3. However, a resin material has a disadvantage that it tends to absorb impurities such as water. To suppress the deterioration of the electron injection property of the electron transport layer 23 as much as possible, it is hence desired to arrange a protective layer 28, which is composed from an inorganic material having resistance to the passage of impurities such as water, on the opposite electrode 18 as illustrated in the modification of FIG. 11.

The protective layer 28 is composed from a transparent insulating inorganic material such as, for example, silicon nitride (SiN) or silicon oxide nitride (SiON), and is deposited by a dry process such as an evaporation process. Desirably, its thickness is 100 nm to 1,000 nm.

(5) In the above-described embodiment, the electron transport layer 23 is configured in the three-layer structure including the first layer portion 15, the second layer portion 16, and the third layer portion 17 as illustrated in FIG. 4. However, the electron transport layer 23 is not necessarily needed to be separated into an exact multilayer form.

Figure 12A:
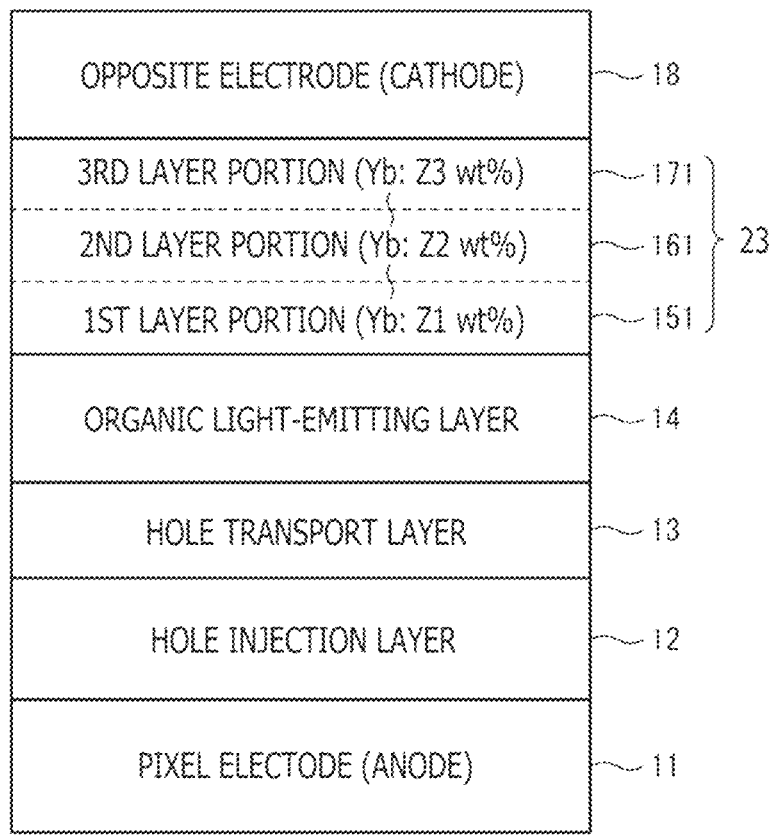
FIG. 12A is a view illustrating a still further illustrative stacked structure of the electron transport layer in the organic EL element according to the first aspect of this disclosure.

As illustrated in FIG. 12A, for example, the electron transport layer 23 may be divided, in the thickness direction thereof, in three regions including a first region 151, a second region 161, and a third region 171, and the doping concentration of Yb may be continuously changed in order of Z1 wt %, Z2 wt %, and Z3 wt %.

Figure 12B:
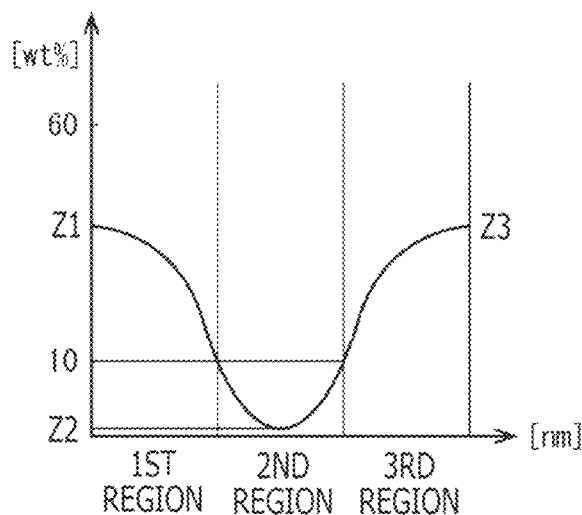
FIGS. 12B and 12C are graphs illustrating examples of changes in the doping concentration of Yb in a thickness direction of the electron transport layer.

FIG. 12B is a graph illustrating an example of changes in doping concentration in the thickness direction of the electron transport layer 23, the axis of abscissas represents the distance of the electron transport layer 23 from the interface with the organic light-emitting layer 14, and the axis of ordinates represents the doping concentration of Yb.

As presented in the graph of FIG. 12B, in the first region 151, the doping concentration of Yb decreases following a gentle curve from Z1 wt %, and in the second region 161, once decreases to Z2 wt % following a downward convex curve and then progressively increases. In the third region 171, the doping concentration of Yb then gently increases and reaches Z3 wt %.

Figure 12C:
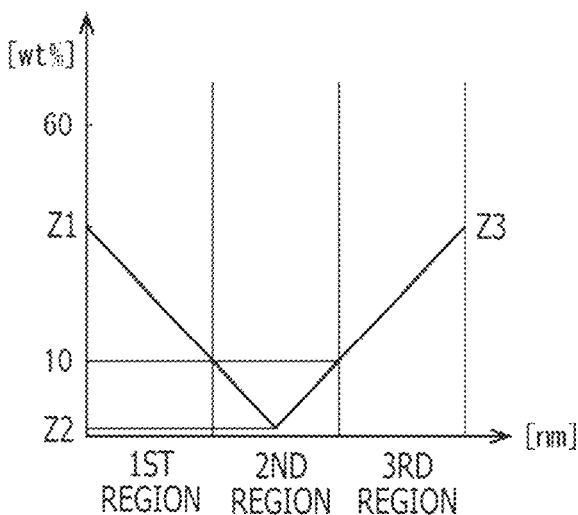

As illustrated in FIG. 12C, the doping concentration of Yb may also be set to once decrease at a substantially constant gradient from Z1 wt % to Z2 wt % over the first region 151 and the second region 161, and then to increase at a substantially constant gradient from Z2 wt % to Z3 wt % from the second region 161 to the third region 171.

In FIGS. 12B and 12C, the graphs illustrating the changes in the doping concentration of Yb are bilaterally symmetrical. However, these graphs are merely illustrative, and no particular limitation is imposed on the course of changes of the doping concentration in each region insofar as the doping concentrations of Yb in the first region 151 and the third region 171 are in a range of 10 wt % or higher and 60 wt % or lower and the doping concentration of Yb in the second region 161 is in a range of 0 wt % or higher and 10 wt % or lower.

As described above, in the thickness direction of the electron transport layer 23, the second region 161 (middle region) is interposed between the first region 151 (the region on the side of the organic light-emitting layer) and the third region 171 (the region on the side of the opposite electrode (cathode)), and the doping concentration of the alkali metal or the like in the second region 161 is lower than the doping concentrations of the alkali metal or the like in the first region 151 and the third region 171. Compared with at least the conventional case that the electron transport layer is a single layer and is evenly doped with a dopant metal at a concentration equal to or higher than the concentration at which electron injection property is ensured, the movement of oxygen ions and the like from the outside into the organic light-emitting layer 14 is hence also suppressed in the second region 161 in this modification, thereby making a contribution to a prolongation of the organic EL element 2.

(6) In the above-described embodiment, the organic EL panel of the so-called pixel bank system is illustrated, in which the column banks 22Y and the row banks 22X (see FIG. 2) are equal in height and the four sides of the organic light-emitting layer in each organic EL element are defined by the associated column banks 22Y and the associated row banks 22X. In a case where the organic light-emitting layers are formed by a wet process, however, the organic EL panel may desirably be configured in a structure of a so-called line bank system, in which the row banks 22X have a lower height than the column banks 22Y and, when inks separately containing materials for the organic light-emitting layers 14 are separately applied dropwise from the corresponding nozzles of a printing machine, the levels of the inks become higher than the height of the row banks 22X.

According to such a line bank system, the dropwise-applied ink for the organic light-emitting layers of each kind of emission color is allowed to flow over a plurality of subpixels of the same emission color. Therefore, the ink can be applied promptly and evenly, and variations hardly occur in luminescence among subpixels.

The following description is of one example of a fabrication process of banks by the above-described line bank system.

(a) To define pixel electrode columns in the Y-direction (see FIG. 2) by each subpixel, the row banks 22X (pixel defining layers) are first formed extending in the X-direction on the substrate 21.

For this purpose, a photosensitive resin material as a material for the row banks 22X is evenly applied above the substrate 21 by a die coating process, a slit coating process, a spin coating process, or the like, followed by drying, so that a row bank material layer is formed with a thickness equal to the height of the row banks 22X to be formed.

Using a photolithography process, patterning is then performed to form the row banks 22X.

(b) In a similar manner, the photosensitive resin material as a material for the column banks 22Y is evenly applied above the substrate 21 by a die coating process, a slit coating process, a spin coating process, or the like, followed by drying, so that a column bank material layer is formed with a thickness equal to the height of the column banks 22Y to be formed. Using a photolithography process, the column bank material layer is subjected to patterning to form the column banks 22Y.

(7) Modification of Stacked Structure of Organic EL Element

In the above-described embodiments, the stacked structure of each organic EL element is described to be in the configuration having the hole injection layer 12, the hole transport layer 13, and the electron transport layer 23, but is not limited to such a configuration. For example, an organic EL element without the hole transport layer 13 may also be possible. Further, in place of the hole injection layer 12 and the hole transport layer 13, for example, a single hole injection and transport layer may be included.

Furthermore, an electron injection layer may be interposed between the electron transport layer 23 and the opposite electrode 18 to provide a configuration that further improves the electron injection property from the electron injection layer. Examples of an organic material for use in such an electron injection layer include low molecular organic n-electron system materials such as oxadiazole derivatives (OXDs), triazole derivatives (TAZs), and phenanthroline derivatives (BCP, Bphen). In these organic materials, one or more of metals belonging to the alkali metal group such as lithium (Li), sodium (Na), potassium (K), rubidium (Rb), cesium (Cs), and francium (Fr), and metals belonging to the alkaline earth group such as calcium (Ca), strontium (Sr), barium (Ba), and radium (Ra), may be doped.

(8) In the organic EL panel 10 according to the above-described embodiment, the subpixels 100R, 100G, and 100B which emit light in R, G and B colors, respectively, are arrayed. However, the emission colors of the subpixels are not limited to them, and may be, for example, four colors including a yellow color (Y) in addition to R, G, B. In addition, each pixel P is not limited to include one subpixel per color, but may include a plurality of subpixels per color. Further, the array of subpixels at each pixel P is not limited to the order of red color, green color, and blue color as illustrated in FIG. 2, but may also be in an order with the colors transposed.

(9) The organic EL panel 10 according to the above-described embodiment adopts the active matrix system. Without being limited to the active matrix system, a passive matrix system may also be adopted. In addition, the above-described organic EL elements can be applied not only to organic EL panels of the top emission type but also to organic EL panels of the bottom emission type.

Figure 13:
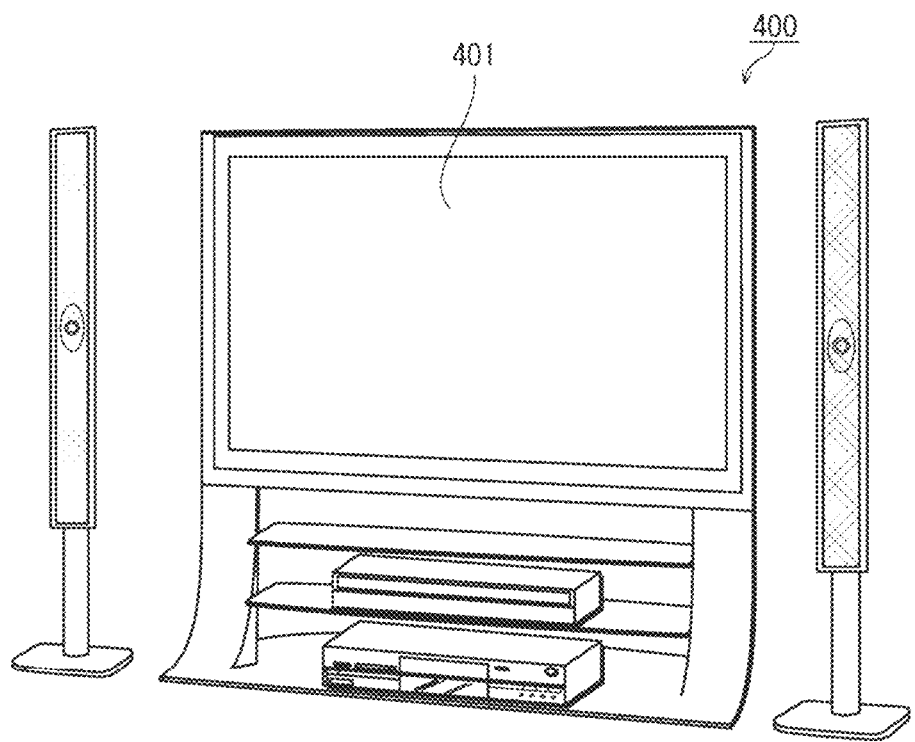
FIG. 13 is a view depicting an example of a TV set as electronic equipment on which an organic EL display device according to a third aspect of this disclosure is mounted.

(10) The organic EL panel described in the above-described embodiment can be used as a display unit 401 of a television set 400 as depicted in FIG. 13, or as a display panel for one of various electronic equipment such as personal computers, mobile terminals, and business displays.

(11) In the above-described embodiment, the description is given of the organic EL element as a self light-emitting element, the organic EL panels using a plurality of such organic EL elements, and the like. In addition, this disclosure can also be applied to self light-emitting panels such as quantum dot panels (see, for example, JP 2010-199067 A) using quantum dot light-emitting diodes (QLED) as self light-emitting elements, because such self light-emitting panels are different from organic EL panels only in the structure and kind of light-emitting layers and are the same as organic EL panels in the configuration that each light-emitting layer and one or more other function layers are interposed between the associated pixel electrode and the associated opposite electrode.

<<Remarks>>

The self light-emitting element and its manufacturing process, and the self light-emitted display device, and electronic equipment, all of which pertain to this disclosure, have been described above based on the embodiments and modifications. However, this disclosure should not be limited to the above-described embodiments and modifications. This disclosure also encompasses modes available by applying various changes, which are conceivable for those skilled in the art, to the above-described embodiments and modifications, and modes realizable by combining the elements and functions of the above-described embodiments and modifications as desired within a scope not departing from the spirit of this disclosure.

The self light-emitting elements according to this disclosure can be widely used as self light-emitting elements in display devices for use in various electronic equipment.

The present disclosure contains subject matter related to that disclosed in Japanese Priority Patent Applications JP 2019-211445 filed in the Japan Patent Office on Nov. 22, 2019 and 2019-48786 filed in the Japan Patent Office on Mar. 15, 2019, the entire contents of which are hereby incorporated by reference.

What is claimed is:

1. A self light-emitting element comprising:
a first electrode;
a light-emitting layer disposed above the first electrode;
a function layer disposed above the light-emitting layer, and doped with a metal; and
a second electrode disposed above the function layer, wherein
the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer.

2. The self light-emitting element according to claim 1, wherein
the first electrode is an anode, the second electrode is a cathode, and the metal doped in the function layer is one or more metals selected from a group of metals belonging to the alkali metal group, the alkaline earth metal group, and the rare earth metal group.

3. The self light-emitting element according to claim 1, wherein
the function layer contains, as a host material, an organic material having at least one of electron transport property or electron injection property.

4. The self light-emitting element according to claim 1, wherein
a non-doped layer not doped with the metal is included as the intermediate layer.

5. The self light-emitting element according to claim 4, wherein
the non-doped layer has a thickness of at least 5 nm.

6. The self light-emitting element according to claim 1, wherein
the function layer has a three-layer structure.

7. The self light-emitting element according to claim 1, wherein
the lowermost layer and the uppermost layer in the function layer each have a thickness of 5 nm or greater and 30 nm or smaller.

8. The self light-emitting element according to claim 1, wherein
the lowermost layer and the uppermost layer in the function layer are each doped with the metal at 10 wt % or higher and 60 wt % or lower.

9. The self light-emitting element according to claim 1, wherein
the lowermost layer of the function layer is doped with the metal at a lower concentration than the uppermost layer.

10. A self light-emitting element comprising:
a first electrode;
a light-emitting layer disposed above the first electrode;
a function layer disposed above the light-emitting layer, and doped with a metal; and
a second electrode disposed above the function layer, wherein
the function layer is divided, in a thickness direction thereof, in a region on a side of the light-emitting layer, a region on a side of the second electrode, and a middle region between the region on the side of the light-emitting layer and the region on the side of the second electrode, and the middle region is doped with the metal at a lower concentration than the region on the side of the light-emitting layer and the region on the side of the second electrode.

11. The self light-emitting element according to claim 1, wherein
the light-emitting layer is a coating film.

12. A self light-emitting display device comprising:
a substrate;
a self light-emitting panel including a substrate and a plurality of self light-emitting elements as arrayed in a matrix pattern above the substrate, the self light-emitting elements each including
a first electrode,
a light-emitting layer disposed above the first electrode,
a function layer disposed above the light-emitting layer, and doped with a metal, and
a second electrode disposed above the function layer,
in which
the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer; and
a drive section configured to drive the self light-emitting panel such that an image is displayed.

13. Electronic equipment comprising:
as an image display section, the self light-emitting display device including
a substrate,
a self light-emitting panel including a substrate and a plurality of self light-emitting elements as arrayed in a matrix pattern above the substrate, the self light-emitting elements each including
a first electrode,
a light-emitting layer disposed above the first electrode,
a function layer disposed above the light-emitting layer, and doped with a metal, and
a second electrode disposed above the function layer,
in which
the function layer has a multilayer structure of at least three layers including an uppermost layer, a lowermost layer, and an intermediate layer between the uppermost layer and the lowermost layer, and the intermediate layer is doped with the metal at a lower concentration than the uppermost layer and the lowermost layer; and
a drive section configured to drive the self light-emitting panel such that an image is displayed.

* * * * *